(12) United States Patent
Aota et al.

(10) Patent No.: US 12,310,226 B2
(45) Date of Patent: May 20, 2025

(54) DISPLAY DEVICE

(71) Applicant: SHARP KABUSHIKI KAISHA, Sakai (JP)

(72) Inventors: Keiji Aota, Sakai (JP); Toshio Etoh, Sakai (JP); Tadashi Nishioka, Sakai (JP); Tsugio Nakazono, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 574 days.

(21) Appl. No.: 17/769,682

(22) PCT Filed: Oct. 29, 2019

(86) PCT No.: PCT/JP2019/042434
§ 371 (c)(1),
(2) Date: Apr. 15, 2022

(87) PCT Pub. No.: WO2021/084630
PCT Pub. Date: May 6, 2021

(65) Prior Publication Data
US 2022/0393119 A1    Dec. 8, 2022

(51) Int. Cl.
*H10K 77/10*    (2023.01)
*H05K 1/18*    (2006.01)
(Continued)

(52) U.S. Cl.
CPC .......... *H10K 77/111* (2023.02); *H05K 1/189* (2013.01); *H10K 50/841* (2023.02); *H10K 59/12* (2023.02);
(Continued)

(58) Field of Classification Search
CPC .... H10K 77/111; H10K 50/841; H10K 59/12; H10K 71/00; H10K 59/1201; H10K 59/871; H10K 59/131; H05K 1/189; H05K 2201/10128; H05K 3/323; H05K 2203/166; G09F 9/30; H05B 33/02; H05B 33/04; H05B 33/06; H05B 33/10
See application file for complete search history.

(56) References Cited

U.S. PATENT DOCUMENTS

| 10,971,438 B2* | 4/2021 | Song ............ H10K 59/131 |
| 2004/0012745 A1 | 1/2004 | Ito |
| 2018/0151536 A1* | 5/2018 | Song ............ H01L 24/83 |

FOREIGN PATENT DOCUMENTS

| JP | H01161597 U | 11/1989 |
| JP | 2001100641 A | 4/2001 |

(Continued)

*Primary Examiner* — J. E. Schoenholtz
(74) *Attorney, Agent, or Firm* — ScienBiziP, P.C.

(57) ABSTRACT

A plurality of terminal portions provided in a frame region include first and second terminal electrodes sequentially arranged from a display region side and electrically connected to each other, COFs provided corresponding to the plurality of terminal portions, respectively, include first and second counter electrodes sequentially arranged from the display region side to be opposed to the first and second terminal electrodes, respectively, and electrically connected to each other, and in at least one terminal portion of the plurality of terminal portions, the second terminal electrode and the second counter electrode are electrically connected to each other through an anisotropic conductive film.

15 Claims, 15 Drawing Sheets

(51) Int. Cl.
*H10K 50/84* (2023.01)
*H10K 59/12* (2023.01)
*H10K 59/131* (2023.01)
*H10K 59/80* (2023.01)
*H10K 71/00* (2023.01)

(52) U.S. Cl.
CPC ......... *H10K 59/131* (2023.02); *H10K 59/871* (2023.02); *H10K 71/00* (2023.02); *H05K 2201/10128* (2013.01); *H10K 59/1201* (2023.02)

(56) References Cited

FOREIGN PATENT DOCUMENTS

| | | |
|---|---|---|
| JP | 2004109969 A | 4/2004 |
| JP | 2010225846 A | 10/2010 |

* cited by examiner

DISPLAY DEVICE

TECHNICAL FIELD

The disclosure relates to a display device and a method for manufacturing the same.

BACKGROUND ART

In recent years, a self-luminous type organic electroluminescence (EL) display device using an organic EL element has attracted attention as a display device that can replace a liquid crystal display device. As the organic EL display device, a flexible organic EL display device has been proposed that has a structure in which a flexible printed circuit board such as a flexible printed circuit (FPC) and a chip on film (COF) is connected to an organic EL display panel having an organic EL element provided on a flexible resin substrate (hereinafter, may be referred to as "flexible substrate").

For example, the flexible printed circuit board is connected to (mounted on) a terminal portion of a frame region around a display region of the organic EL display panel by crimping using an anisotropic conductive film (ACF). As a result, electrodes arranged in the terminal portion and the flexible printed circuit board are electrically connected to each other through the anisotropic conductive film.

For example, PTL 1 discloses connection between a panel and a printed circuit board (flexible printed circuit board), disposed along one side of the panel, using a plurality of flexible substrates.

CITATION LIST

Patent Literature

PTL 1: JP 2004-109969 A

SUMMARY

Technical Problem

However, in the known display device described above, the flexible substrate and the flexible printed circuit board are flexible. Thus, with the known display device, crimping of the flexible printed circuit board to the terminal portion might involve connection failure due to attachment of foreign matters, misaligned crimping, non-uniform crimping pressure, insufficient heating, and the like, and may also result in damage on a part or the like. When this happens, the usable display panel cannot be reused. Thus, there has been a problem in that the manufacturing yield of the display device might be compromised.

The disclosure has been made in view of the above, and an object of the disclosure is to improve the manufacturing yield of a display device in which a flexible printed circuit board is mounted.

Solution to Problem

In order to achieve the above-described object, a display device according to the disclosure includes: a flexible substrate; a thin film transistor layer provided on the flexible substrate; a light-emitting element layer provided on the thin film transistor layer, the light-emitting element layer including a first electrode, a function layer, and a second electrode and configuring a display region; a sealing layer provided to cover the light-emitting element layer; a frame region provided around the display region; a plurality of terminal portions provided in the frame region and each including a plurality of terminal electrodes that are arranged; and a plurality of flexible printed circuit boards provided corresponding to the plurality of terminal portions, respectively, and each including a plurality of counter electrodes that are arranged and opposed to the plurality of terminal electrodes, respectively, wherein the plurality of counter electrodes each include a first counter electrode and a second counter electrode electrically connected to the first counter electrode, the first counter electrode and the second counter electrode being sequentially arranged from the display region side, the plurality of terminal portions each include, as the plurality of terminal electrodes, a first terminal electrode and a second terminal electrode electrically connected to the first terminal electrode, the first terminal electrode and the second terminal electrode being sequentially arranged from the display region side, and in at least one terminal portion of the plurality of terminal portions, the second terminal electrode and the second counter electrode are electrically connected to each other through an anisotropic conductive film.

Advantageous Effects of Disclosure

According to the disclosure, the plurality of terminal portions each include, as the plurality of terminal electrodes, a first terminal electrode and a second terminal electrode electrically connected to the first terminal electrode. These two terminal electrodes are formed on the organic EL display panel side, and thus the manufacturing yield of the display device on which the flexible printed circuit board is mounted can be improved.

DESCRIPTION OF EMBODIMENTS

Embodiments of the disclosure will be described below in detail with reference to the drawings. Note that the disclosure is not limited to each embodiment to be described below.

First Embodiment

Figure 1:
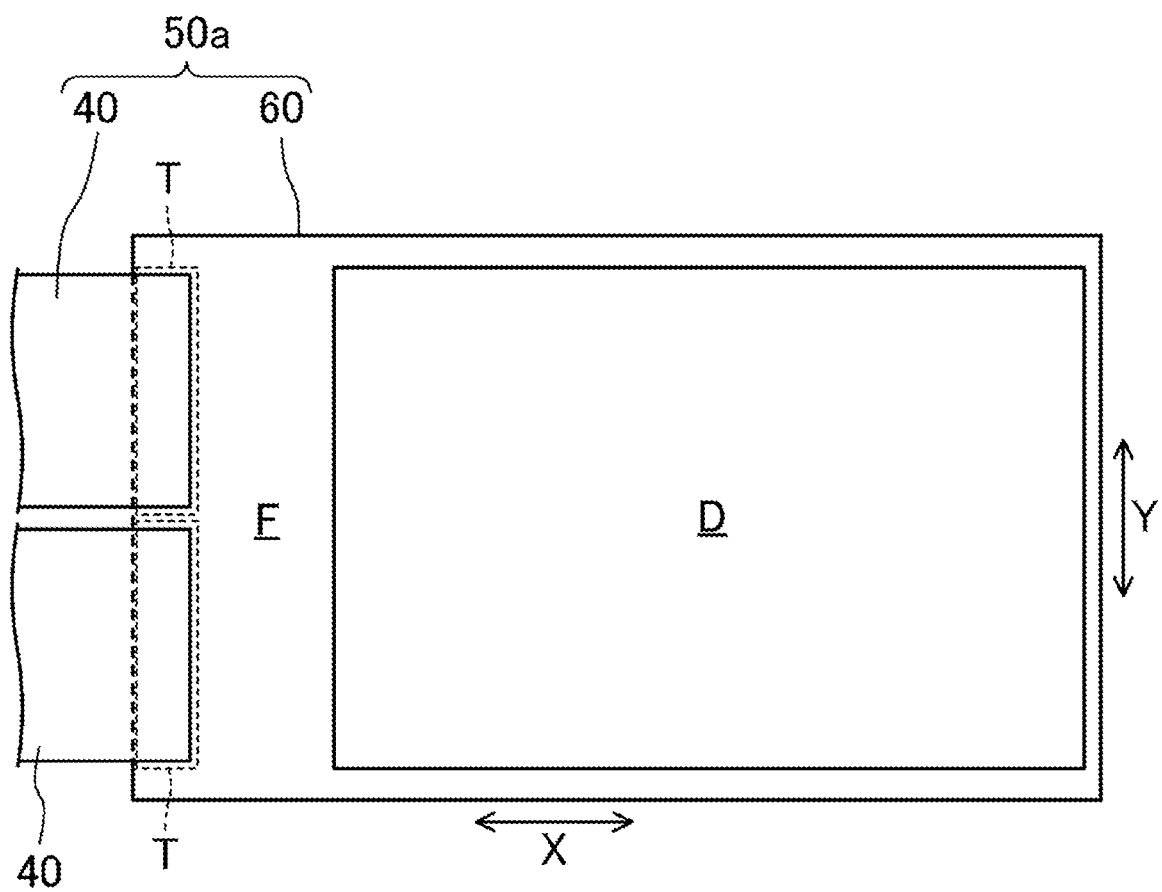
FIG. 1 is a plan view illustrating a schematic configuration of an organic EL display device according to a first embodiment of the disclosure.
Figure 2:
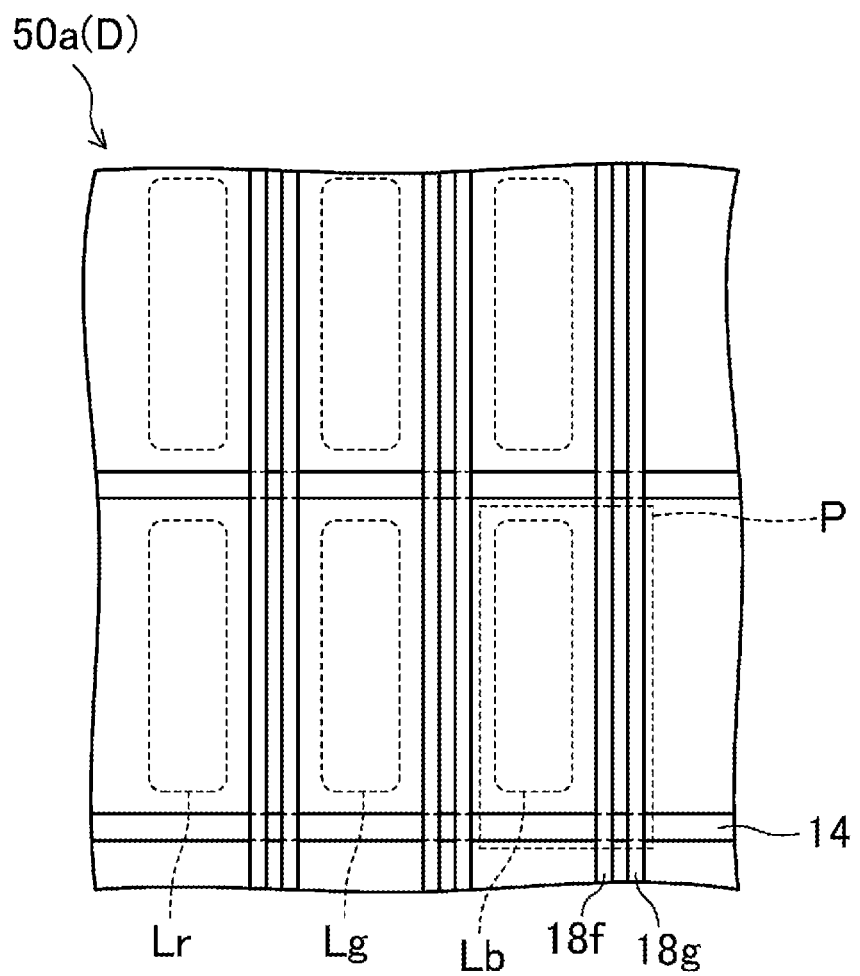
FIG. 2 is a side view illustrating a schematic configuration of the organic EL display device according to the first embodiment of the disclosure.
Figure 3:
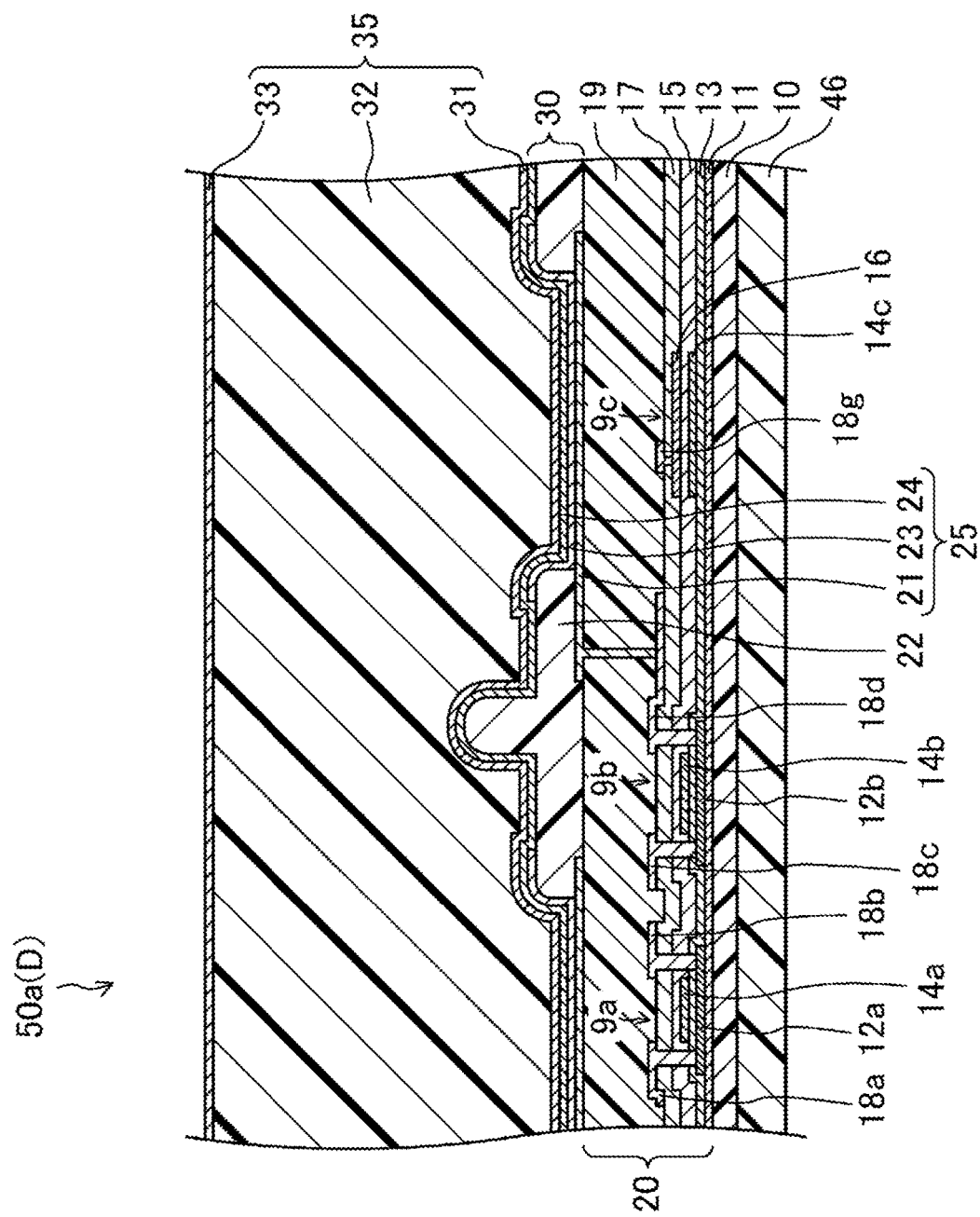
FIG. 3 is a cross-sectional view of a display region of the organic EL display device according to the first embodiment of the disclosure.
Figure 4:
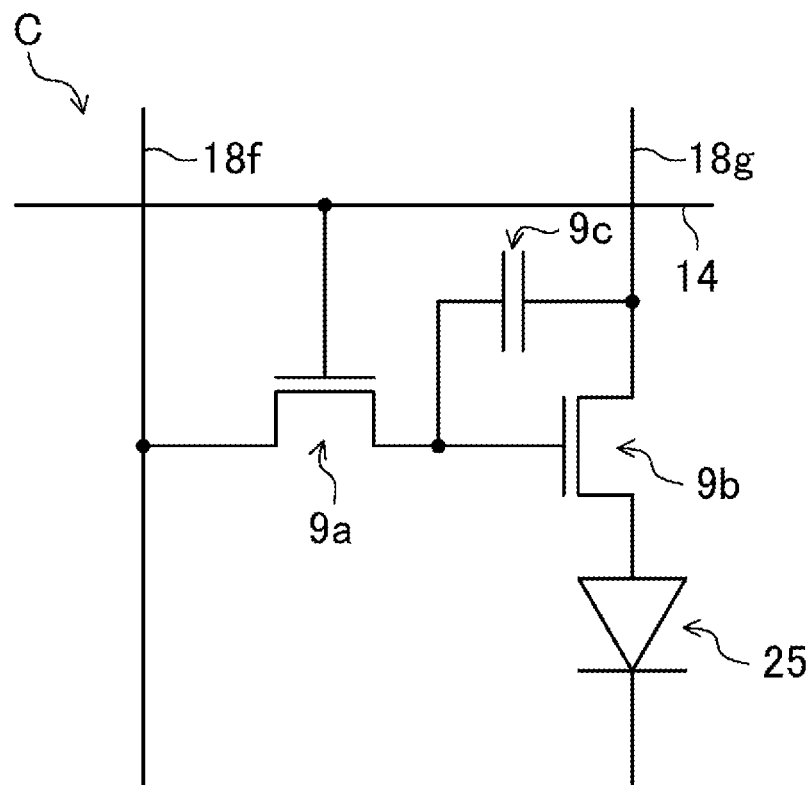
FIG. 4 is an equivalent circuit diagram illustrating a pixel circuit of the organic EL display device according to the first embodiment of the disclosure.
Figure 5:
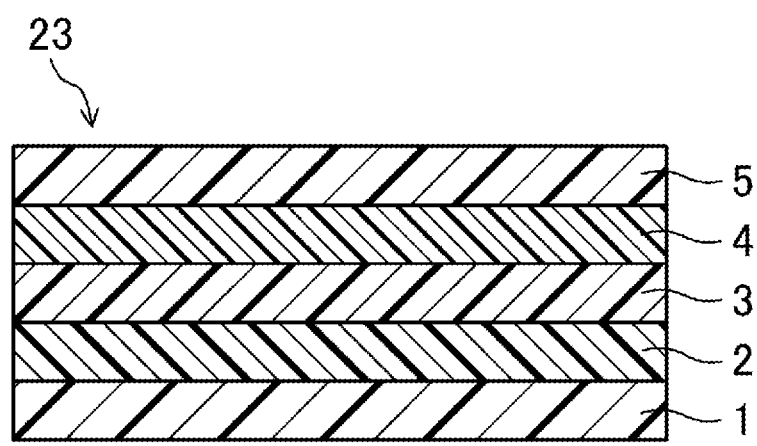
FIG. 5 is a cross-sectional view of an organic EL layer of the organic EL display device according to the first embodiment of the disclosure.
Figure 6:
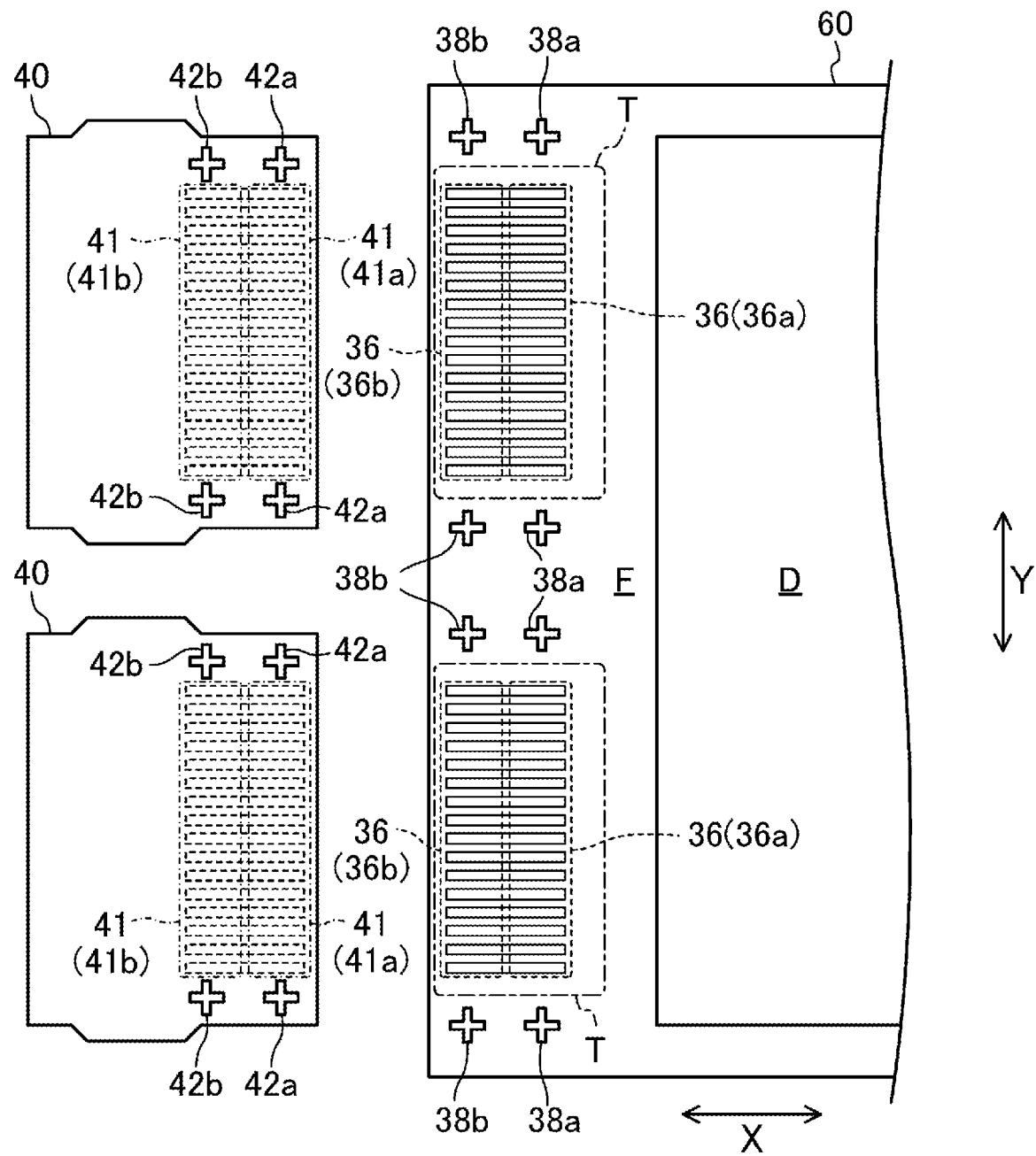
FIG. 6 is a plan view illustrating an organic EL display panel of the organic EL display device and flexible printed circuit boards before being connected to the organic EL display panel according to the first embodiment of the disclosure.
Figure 7:
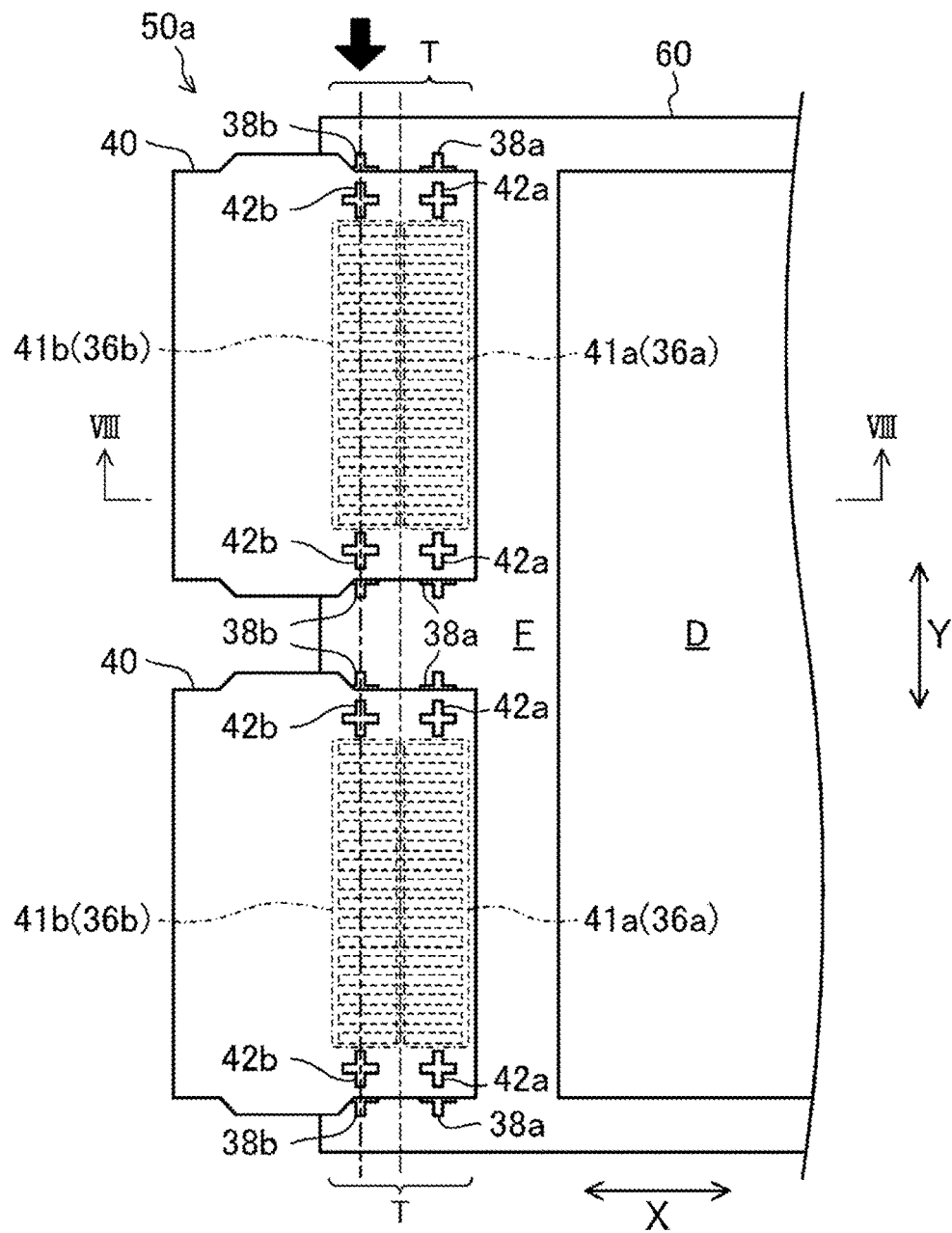
FIG. 7 is a plan view for describing a flexible printed circuit mounting step in a method for manufacturing the organic EL display device according to the first embodiment of the disclosure.
Figure 8:
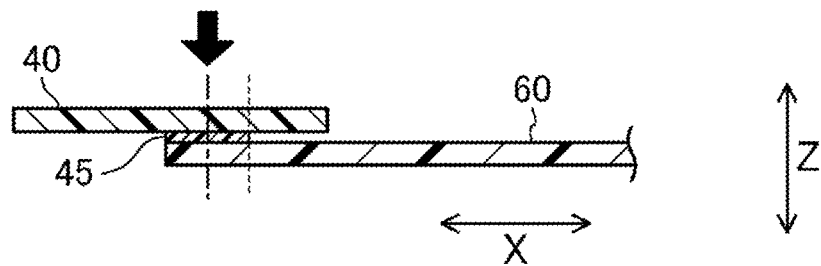
FIG. 8 is a cross-sectional view, taken along line VIII-VIII in FIG. 7, for describing the flexible printed circuit mounting step in the method for manufacturing the organic EL display device according to the first embodiment of the disclosure.
Figure 9:
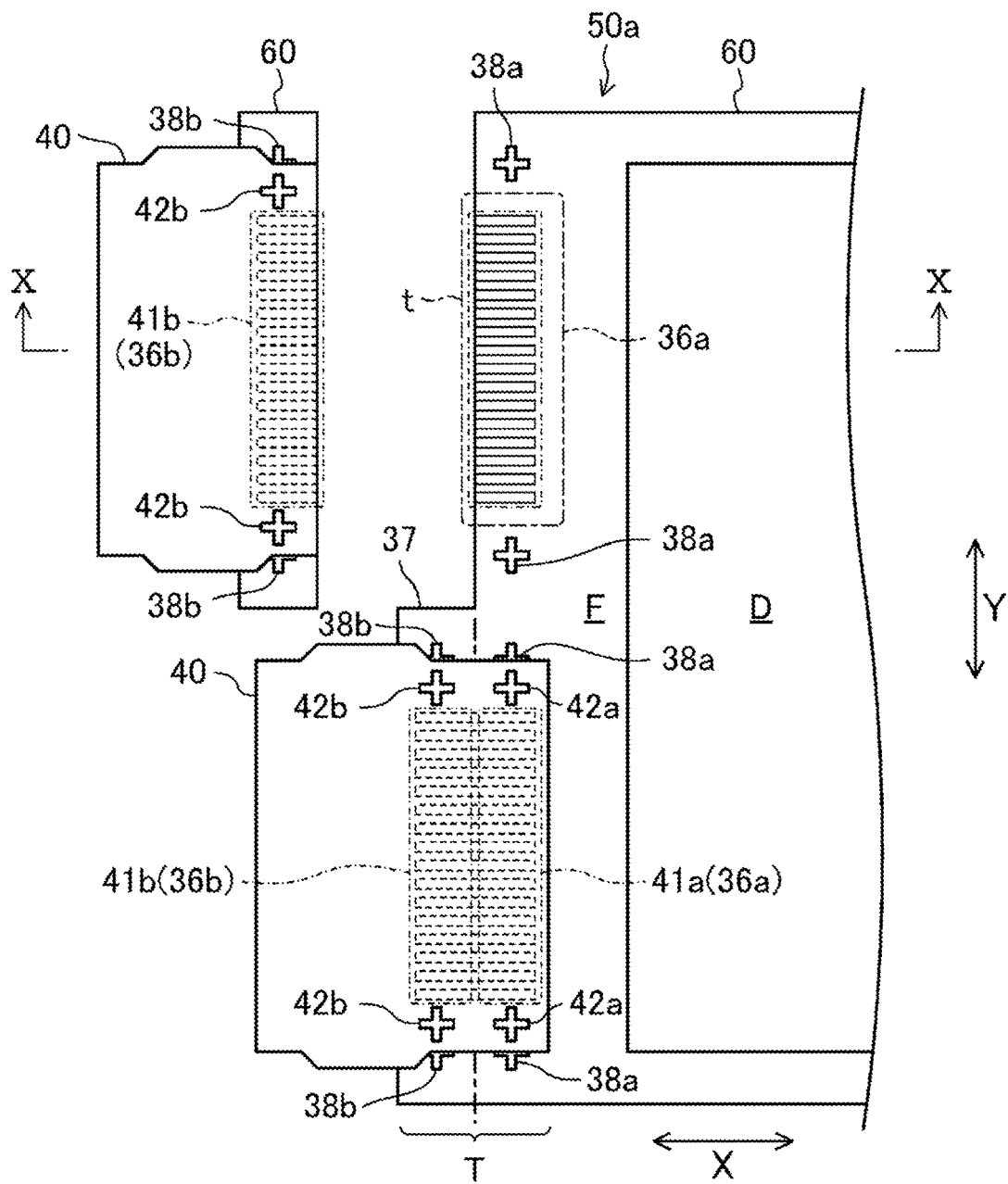
FIG. 9 is a plan view for describing a cutting step in the method for manufacturing the organic EL display device according to the first embodiment of the disclosure.
Figure 10:
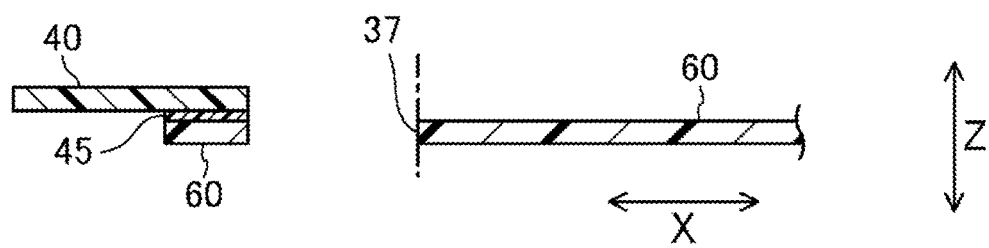
FIG. 10 is a cross-sectional view, taken along line X-X in FIG. 9, for describing the cutting step in the method for manufacturing the organic EL display device according to the first embodiment of the disclosure.
Figure 11:
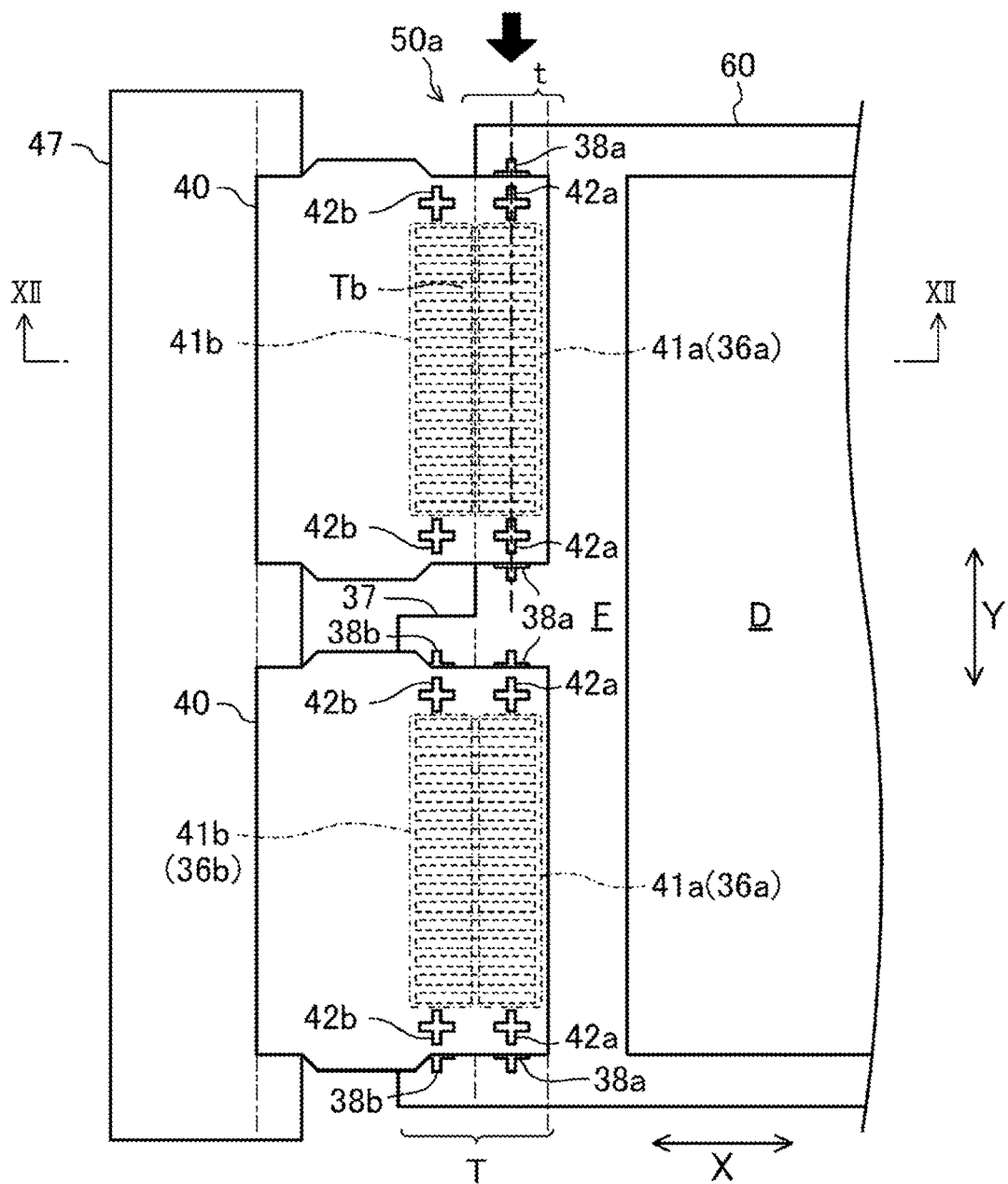
FIG. 11 is a plan view for describing a connection step in the method for manufacturing the organic EL display device according to the first embodiment of the disclosure.
Figure 12:
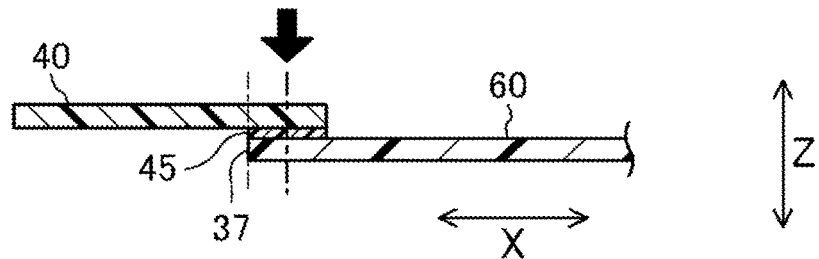
FIG. 12 is a cross-sectional view, taken along line XII-XII in FIG. 11, for describing the connection step in the method for manufacturing the organic EL display device according to the first embodiment of the disclosure.
Figure 13:
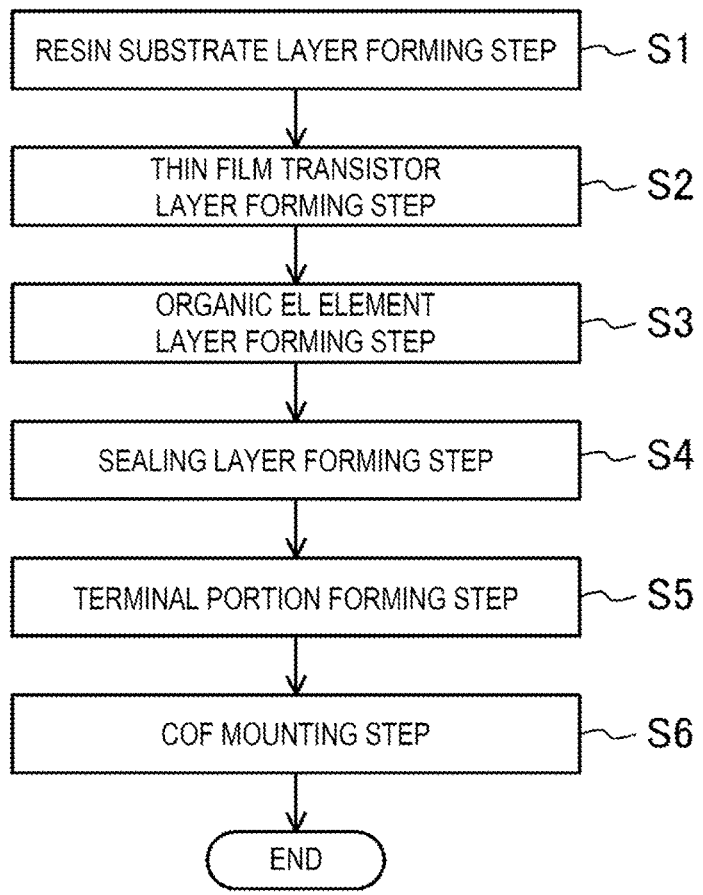
FIG. 13 is a flowchart illustrating the method for manufacturing the organic EL display device according to the first embodiment of the disclosure.
Figure 14:
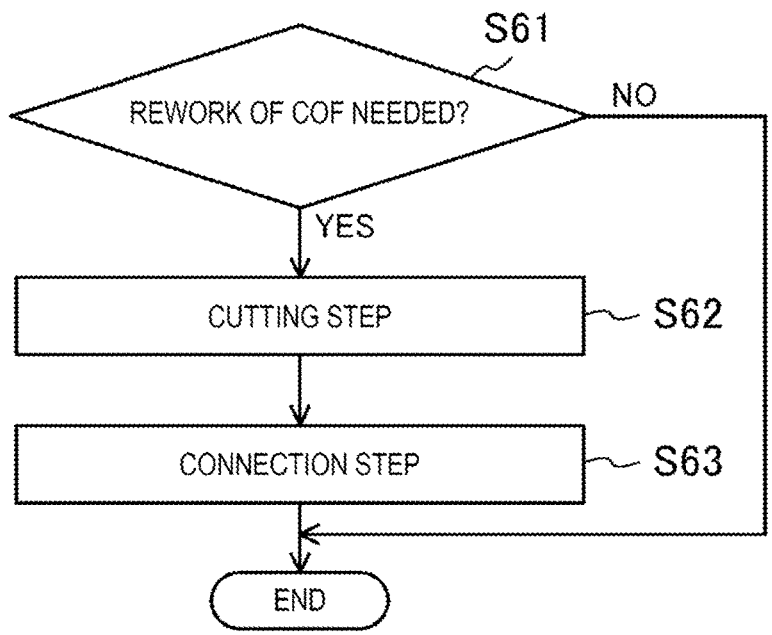
FIG. 14 is a flowchart illustrating details of the flexible printed circuit mounting step in the method for manufacturing the organic EL display device according to the first embodiment of the disclosure.

FIG. 1 to FIG. 14 illustrate a first embodiment of a display device according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50*a* according to the present embodiment. FIG. 2 is a side view illustrating a schematic configuration of the organic EL display device 50*a*. FIG. 3 is a cross-sectional view of a display region D of the organic EL display device 50*a*. FIG. 4 is an equivalent circuit diagram illustrating a pixel circuit of the organic EL display device 50*a*. FIG. 5 is a cross-sectional view of an organic EL layer of the organic EL display device 50*a*. FIG. 6 is a plan view illustrating an organic EL display panel 60 of the organic EL display device 50*a* and chip-on-films (COFs) 40 before being connected to the organic EL display panel 60. FIG. 7 is a plan view for describing a COF mounting step S6 in a method for manufacturing the organic EL display device 50*a*. FIG. 8 is a cross-sectional view, taken along line VIII-VIII in FIG. 7, for describing the COF mounting step S6 in the method for manufacturing the organic EL display device 50*a*. FIG. 9 is a plan view for describing a cutting step S62 in the method for manufacturing the organic EL display device 50*a*. FIG. 10 is a cross-sectional view, taken along line X-X in FIG. 9, for describing the cutting step S62 in the method for manufacturing the organic EL display device 50*a*. FIG. 11 is a plan view for describing a connection step S63 in the method for manufacturing the organic EL display device 50*a*. FIG. 12 is a cross-sectional view, taken along line XII-XII in FIG. 11, for describing the connection step S63 in the method for manufacturing the organic EL display device 50*a*. FIG. 13 is a flowchart illustrating the method for manufacturing the organic EL display device 50*a*. FIG. 14 is a flowchart illustrating details of the COF mounting step S6 in the method for manufacturing the organic EL display device 50*a*.

As illustrated in FIG. 1, the organic EL display device 50*a* includes the organic EL display panel 60 and the COFs 40 provided as flexible printed circuit boards. The organic EL display panel 60 includes, for example, the display region D having a rectangular shape and displaying an image, and a frame region F having a frame shape and provided around the display region D. Note that in the present embodiment, the display region D having the rectangular shape is exemplified, but the rectangular shape includes a substantial rectangular shape such as a shape whose sides are arc-shaped, a shape whose corners are arc-shaped, and a shape in which a part of a side has a notch.

As illustrated in FIG. 2, a plurality of subpixels P are arranged in a matrix shape in the display region D. In addition, in the display region D, for example, a subpixel P including a red light-emitting region Lr for displaying a red color, a subpixel P including a green light-emitting region Lg for displaying a green color, and a subpixel P including a blue light-emitting region Lb for displaying a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D.

A plurality of (two in FIG. 1) terminal portions T are provided in a left end portion of the frame region F in FIG. 1. As illustrated in FIG. 1, the COF 40 is attached to the terminal portion T with an anisotropic conductive film 45 interposed therebetween (also see FIG. 8, FIG. 10, and FIG. 12). Note that, in the organic EL display device 50a, a direction X parallel to a substrate surface of a resin substrate layer 10 described below (see FIG. 1), a direction Y perpendicular to the direction X and parallel to the substrate surface of the resin substrate layer 10 (see FIG. 1), and a direction Z perpendicular to the direction X and the direction Y (see FIG. 8, FIG. 10, and FIG. 12) are defined.

As illustrated in FIG. 3, the organic EL display device 50a includes, in the display region D, the resin substrate layer 10 provided as a flexible substrate, a thin film transistor (TFT) layer 20 provided on the resin substrate layer 10 and in which a plurality of TFTs are provided, an organic EL element layer 30 provided on the TFT layer 20 as a light-emitting element layer configuring the display region D, and a sealing layer 35 provided on the organic EL element layer 30. Further, a protection film layer 46 is provided on the back surface (the lower side surface in FIG. 3) of the resin substrate layer 10.

The resin substrate layer 10 is formed, for example, of a polyimide resin or the like.

As illustrated in FIG. 3, the TFT layer 20 includes a base coat film 11 provided on the resin substrate layer 10, a first TFT 9a, a second TFT 9b, and a capacitor 9c provided on the base coat film 11 for each of the subpixels P as the pixel circuit C (see FIG. 4), and a TFT flattening film 19 provided on each of the first TFTs 9a, the second TFTs 9b, and the capacitors 9c. Here, in the TFT layer 20, a plurality of the pixel circuits C are arranged in a matrix shape corresponding to the plurality of subpixels P. Further, in the TFT layer 20, as illustrated in FIG. 2 and FIG. 4, a plurality of gate lines 14 are provided so as to extend parallel to each other in the lateral direction in the drawings. Further, in the TFT layer 20, as illustrated in FIG. 2 and FIG. 4, a plurality of source lines 18f are provided so as to extend parallel to each other in a vertical direction in the drawings. Further, in the TFT layer 20, as illustrated in FIG. 2 and FIG. 4, a plurality of power source lines 18g are provided so as to extend parallel to each other in the vertical direction in the drawings. Note that, as illustrated in FIG. 3, each of the power source lines 18g is provided so as to be adjacent to each of the source lines 18f.

The base coat film 11 is formed of a single-layer film or a layered film of an inorganic insulating film made of, for example, silicon nitride, silicon oxide, silicon oxynitride, or the like.

The first TFT 9a is electrically connected to the corresponding gate line 14 and source line 18f in each of the subpixels P, as illustrated in FIG. 4. Additionally, as illustrated in FIG. 3, the first TFT 9a includes a semiconductor layer 12a, a gate insulating film 13, a gate electrode 14a, a first interlayer insulating film 15, a second interlayer insulating film 17, and a source electrode 18a and a drain electrode 18b, which are provided in this order on the base coat film 11. As illustrated in FIG. 3, the semiconductor layer 12a is provided in an island shape with a polysilicon film on the base coat film 11, for example, and includes a channel region, a source region, and a drain region. Additionally, as illustrated in FIG. 3, the gate insulating film 13 is provided so as to cover the semiconductor layer 12a.

Additionally, as illustrated in FIG. 3, the gate electrode 14a is provided on the gate insulating film 13 such that the gate electrode 14a overlaps with the channel region of the semiconductor layer 12a. Additionally, as illustrated in FIG. 3, the first interlayer insulating film 15 and the second interlayer insulating film 17 are sequentially provided so as to cover the gate electrode 14a. Additionally, as illustrated in FIG. 3, the source electrode 18a and the drain electrode 18b are separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17. Note that the gate insulating film 13, the first interlayer insulating film 15, and the second interlayer insulating film 17 are each constituted by a single-layer film or a layered film of an inorganic insulating film made of, for example, silicon nitride, silicon oxide, or silicon oxynitride.

The second TFT 9b is electrically connected to the corresponding first TFT 9a and power source line 18g in each of the subpixels P, as illustrated in FIG. 4. As illustrated in FIG. 3, the second TFT 9b includes a semiconductor layer 12b, the gate insulating film 13, a gate electrode 14b, the first interlayer insulating film 15, the second interlayer insulating film 17, and a source electrode 18c and a drain electrode 18d, which are provided in this order on the base coat film 11. As illustrated in FIG. 3, the semiconductor layer 12b is provided in an island shape with a polysilicon film on the base coat film 11, for example, and includes a channel region, a source region, and a drain region. Additionally, as illustrated in FIG. 3, the gate insulating film 13 is provided covering the semiconductor layer 12b. Additionally, as illustrated in FIG. 3, the gate electrode 14b is provided on the gate insulating film 13 such that the gate electrode 14b overlaps with the channel region of the semiconductor layer 12b. Additionally, as illustrated in FIG. 3, the first interlayer insulating film 15 and the second interlayer insulating film 17 are provided in this order to cover the gate electrode 14b. Additionally, as illustrated in FIG. 3, the source electrode 18c and the drain electrode 18d are separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that in the present embodiment, the first TFT 9a and the second TFT 9b are exemplified as being of a top-gate type, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes a lower conductive layer 14c formed of the same material as and in the same layer as the gate electrodes 14a and 14b, the first interlayer insulating film 15 provided so as to cover the lower conductive layer 14c, and an upper conductive layer 16 provided on the first interlayer insulating film 15 so as to overlap with the lower conductive layer 14c. Note that, as illustrated in FIG. 3, the upper conductive layer 16 is electrically connected to the power source line 18*g* via a contact hole formed in the second interlayer insulating film 17.

The flattening film 19 has a flat surface in the display region D, and is formed, for example, of an organic resin material such as a polyimide resin.

As illustrated in FIG. 3, the organic EL element layer 30 includes a plurality of organic EL elements 25 provided on the flattening film 19 as a plurality of light-emitting elements arranged in a matrix shape in correspondence with the plurality of pixel circuits C.

As illustrated in FIG. 3, the organic EL elements 25 each include a first electrode 21 provided on the flattening film 19, an organic EL layer 23 provided on the first electrode 21, and a second electrode 24 provided on the organic EL layer 23 to be common to the entire display region D.

As illustrated in FIG. 3, each of the first electrodes 21 is electrically connected to the drain electrode 18*d* (or the source electrode 18*c*) of the corresponding second TFT 9*b* via a contact hole formed in the flattening film 19. In addition, the first electrodes 21 have a function of injecting holes (positive holes) into the organic EL layer 23. In addition, the first electrodes 21 are preferably formed of a material with a high work function to improve the efficiency of hole injection into the organic EL layer 23. Here, examples of a material constituting the first electrodes 21 include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Further, the material constituting the first electrodes 21 may be an alloy of astatine (At)/astatine oxide ($AtO_2$), and the like, for example. Furthermore, a material constituting the first electrodes 21 may be electrically conductive oxide, for example, tin oxide (SnO), zinc oxide (ZnO), indium tin oxide (ITO), or indium zinc oxide (IZO). In addition, the first electrodes 21 may be formed by layering a plurality of layers formed of any of the materials described above. Note that, examples of compound materials having a large work function include indium tin oxide (ITO) and indium zinc oxide (IZO). The circumferential end portion of the first electrode 21 is covered with an edge cover 22 provided in a lattice pattern in the entire display region D. Here, examples of a material constituting the edge cover 22 include a positive-working photosensitive resin such as a polyimide resin, an acrylic resin, a polysiloxane resin, and a novolac resin.

As illustrated in FIG. 5, the organic EL layer 23 includes a hole injection layer 1, a hole transport layer 2, a light-emitting layer 3, an electron transport layer 4, and an electron injection layer 5 that are sequentially provided on the first electrode 21.

The hole injection layer 1 is also referred to as an anode electrode buffer layer, and has a function of reducing an energy level difference between the first electrodes 21 and the organic EL layers 23 to thereby improve the efficiency of hole injection into the organic EL layers 23 from the first electrodes 21. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives, and the like.

The hole transport layer 2 has a function of improving the efficiency of hole transport from the first electrodes 21 to the organic EL layers 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide, and the like.

The light-emitting layer 3 is a region where holes and electrons are injected from the first electrode 21 and the second electrode 24, respectively, and the holes and the electrons recombine, when a voltage is applied via the first electrode 21 and the second electrode 24. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, acridine derivatives, phenoxazone, quinacridone derivatives, rubrene, poly-p-phenylenevinylene, polysilane, and the like.

The electron transport layer 4 has a function of facilitating migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds, and the like, as organic compounds.

The electron injection layer 5 has a function of reducing an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), strontium oxide (SrO), and the like.

As illustrated in FIG. 3, the second electrode 24 is provided to cover the organic EL layer 23 of each of the subpixels P and the edge cover 22 common to all the subpixels P. In addition, the second electrode 24 has a function of injecting electrons into the organic EL layer 23. In addition, the second electrode 24 is preferably formed of a material with a low work function to improve the efficiency of electron injection into the organic EL layer 23. Here, examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of alloys such as magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of electrically conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al), and the like.

As illustrated in FIG. 3, the sealing layer 35 is provided on the organic EL element layer 30 so as to cover each of the organic EL elements 25. Specifically, as illustrated in FIG. 3, the sealing layer 35 includes a first sealing inorganic insulating film 31 provided on the resin substrate layer 10 side to cover the second electrode 24, a sealing organic film 32 provided on the first sealing inorganic insulating film 31, and a second sealing inorganic insulating film 33 provided to cover the sealing organic film 32. The sealing layer 35 has a function of protecting the organic EL layer 23 from moisture, oxygen, or the like. Here, the first sealing inorganic insulating film 31 and the second sealing inorganic insulating film 33 are each formed of, for example, an inorganic material such as silicon oxide ($SiO_2$), aluminum oxide ($Al_2O_3$), silicon nitride (SiNx (x is a positive number)) such as trisilicon tetranitride ($Si_3N_4$), or silicon carbonitride (SiCN). Further, the sealing organic film 32 is formed of, for example, an organic material such as acrylic resin, polyurea resin, parylene resin, polyimide resin, and polyamide resin.

As illustrated in FIG. 3, the protection film layer 46 is bonded to a surface, of the resin substrate layer 10, opposite from the surface on which the TFT layer 20 is provided (the lower side surface of the resin substrate layer 10 in FIG. 3) with an adhesive layer interposed therebetween (not illustrated). Further, the protection film layer 46 is disposed over the entire display region D and frame region F. Note that the protection film layer 46 is constituted by, for example, a plastic film formed of a polyethylene terephthalate (PET) resin or the like.

In the organic EL display device 50a, as illustrated in FIG. 6, a plurality of terminal electrodes 36 are arranged in each of the terminal portions T, along the direction Y in which the terminal portions T extend. The terminal electrodes 36 are for inputting signals from outside. Here, as illustrated in FIG. 6, the terminal portions T each include a plurality of first terminal electrodes 36a and a plurality of second terminal electrodes 36b as the plurality of terminal electrodes 36.

As illustrated in FIG. 6, the first terminal electrodes 36a and the second terminal electrodes 36b are sequentially arranged from the display region D side (right side in FIG. 6). Each set of a first terminal electrode 36a and a second terminal electrode 36b corresponding to each other is provided continuously. As for the expression "provided continuously", there is a case in which a diode formed by a transistor is interposed between a terminal portion and a wiring line (near the terminal portion) to remove noise of an input signal, and such a case does not impair the object of the disclosure and is also included in the meaning of "provided continuously" of the disclosure. In other words, the first terminal electrodes 36a and the second terminal electrodes 36b are provided as linearly integrated electrodes extending in the direction X. The first terminal electrode 36a and the second terminal electrode 36b corresponding to each other are electrically connected to each other.

In the organic EL display device 50a, as illustrated in FIG. 1, and FIG. 6 to FIG. 12, the COFs 40 are provided corresponding to the terminal portions T, respectively. The COFs 40 each include an integrated circuit (IC) chip.

In the right end portion (end portion on the display region D side) of the COF 40 in FIG. 6, a plurality of counter electrodes 41 are arranged along the direction Y and opposed to the plurality of terminal electrodes 36, respectively. The plurality of counter electrodes 41 include a plurality of first counter electrodes 41a and a plurality of second counter electrodes 41b. The pitch between adjacent ones of the first counter electrodes 41a is the same as the pitch between the corresponding first terminal electrodes 36a. The pitch between adjacent ones of the second counter electrodes 41b is the same as the pitch between the corresponding second terminal electrodes 36b.

The first counter electrodes 41a and the second counter electrodes 41b are sequentially arranged from the display region D side, as illustrated in FIG. 6 to FIG. 12. Each set of a first counter electrode 41a and a second counter electrode 41b corresponding to each other is provided continuously. In other words, the first counter electrodes 41a and the second counter electrodes 41b are provided as linearly integrated electrodes extending in the direction X. The first counter electrode 41a and the second counter electrode 41b corresponding to each other are electrically connected to each other.

As indicated by arrows in FIG. 7 and FIG. 8, in at least one terminal portion T of the plurality of terminal portions T (hereinafter, may be simply referred to as "terminal portion T") in the organic EL display device 50a, the second terminal electrodes 36b and the second counter electrodes 41b are electrically connected to each other by thermocompression bonding, with the anisotropic conductive film 45 (having a thickness of about 15 μm) interposed therebetween. More specifically, in the terminal portion T, each one of the plurality of second terminal electrodes 36b and a corresponding one of the plurality of second counter electrodes 41b are electrically connected to each other.

On the other hand, in the terminal portion T, the first terminal electrodes 36a and the first counter electrodes 41a are separated from each other. In other words, in the terminal portion T, between the first terminal electrodes 36a and the first counter electrodes 41a, the anisotropic conductive film 45 is not interposed and a space exists. Thus, in the terminal portion T, the first terminal electrodes 36a and the first counter electrodes 41a are opposed to each other with a gap (spacing) in between. That is, the first terminal electrodes 36a and the first counter electrodes 41a are not connected electrically or physically.

The organic EL display device 50a has the first terminal electrodes 36a and the second terminal electrodes 36b provided in the terminal portion T in a manner described above. Only the second terminal electrodes 36b and the second counter electrodes 41b are electrically connected to each other in the terminal portion T.

With this configuration, even when the crimping of the COF 40 to the terminal portion T (thermocompression bonding of the second terminal electrodes 36b and the second counter electrodes 41b) involves connection failure due to attachment or mixing of foreign matters, misaligned crimping, non-uniform crimping pressure, insufficient heating, and the like, or results in damage on the COF 40 and the like in the organic EL display device 50a, the organic EL display device 50a with the COF 40 mounting failure can be reused instead of being discarded.

For example, when COF 40 mounting failure occurs in the terminal portion T on the upper side in FIG. 7 of the two terminal portions T illustrated in FIG. 7, as illustrated in FIG. 9 and FIG. 10, a part of the terminal portion T where the mounting failure has occurred is partially cut off together with the mounted COF 40, by means of irradiation with a laser beam from the back side of the mounted surface, for example. More specifically, as illustrated in FIG. 9 and FIG. 10, a notch portion 37 is provided as a result of notching a region, in the terminal portion T in which the COF 40 mounting failure has occurred, having one side being a straight line connecting the boundaries between the first terminal electrodes 36a and the second terminal electrodes 36b and surrounding the entirety of the second terminal electrodes 36b. As a result, in the terminal portion T, the entirety of the second terminal electrodes 36b is separated from the first terminal electrodes 36a, together with the second counter electrodes 41b of the COF 40.

As described above, in the terminal portion T on which the COF 40 is mounted, the first terminal electrodes 36a and the first counter electrodes 41a are not electrically or physically connected to each other. In other words, the first terminal electrodes 36a and the first counter electrodes 41a are not connected to each other by crimping. Thus, as illustrated in FIG. 9 and FIG. 10, when the region surrounding the entirety of the second terminal electrodes 36b is cut off from the terminal portion T, the first counter electrodes 41a separated from the second counter electrodes 41b are also separated from the terminal portion T. This means that the entirety of the COF 40 in which the mounting failure has occurred is separated from the terminal portion T. As a result, as illustrated in FIG. 9, another terminal portion t including only the first terminal electrodes 36a is formed in the organic EL display panel 60.

In the other terminal portion t, the length of the terminal electrodes 36 (that is, the first terminal electrodes 36a) is configured to be smaller than the length of the terminal electrodes 36 (that is, the first terminal electrodes 36a and the second terminal electrodes 36b) in the remaining terminal portion T. The other terminal portion t is provided with the notch portion 37.

The other terminal portion t, among the terminal portions T, serves as a redundancy (spare) terminal portion for reworking (reconnecting) the COF 40. On the other hand, the terminal portions T can be regarded as rework-supporting terminal portions, including the other terminal portion t, for reworking the COF 40.

In the organic EL display device 50a in which the COF 40 mounting failure has occurred, as illustrated in FIG. 11 and FIG. 12, a new COF 40 (different from the COF 40 that has been cut off) is connected to the other terminal portion t of the organic EL display panel 60. More specifically, as indicated by arrows in FIG. 11 and FIG. 12, in the other terminal portion t, the first terminal electrodes 36a and the first counter electrodes 41a are electrically connected to each other through the anisotropic conductive film 45. On the other hand, as illustrated in FIG. 11, in the other terminal portion t, the second counter electrodes 41b of the COF 40 face the notch portion 37. Thus, in the other terminal portion t on which the new COF 40 has been mounted after the rework, only the first terminal electrodes 36a and the first counter electrodes 41a are electrically connected to each other.

As described above, in the organic EL display device 50a, even when the COF 40 mounting failure occurs, by forming the other terminal portion t from the terminal portion T, a new COF 40 can be connected to the other terminal portion t. Thus, the organic EL display panel 60 in which the COF 40 mounting failure has occurred can be reused by cutting off the COF 40 the mounting of which has failed from the terminal portion T and mounting another COF 40 on the other terminal portion t. As a result, the manufacturing yield of the organic EL display device 50a on which the COF 40 is mounted can be improved.

In the organic EL display device 50a, as illustrated in FIG. 11, a display region D side (right side in FIG. 11) end face of the COF 40 connected to the terminal portion T and a display region D side end face of the COF 40 connected to the other terminal portion t are flush (in other words, the positions of both end faces are aligned). Similarly, an end face of the COF 40 connected to the terminal portion T (left side in FIG. 11) opposite to the display region D side and an end face of the COF 40 connected to the other terminal portion t opposite to the display region D side are flush. Thus, in the direction X, the position of the COF 40 reworked on the other terminal portion t is the same as the position of the COF 40 (successfully mounted without the rework) connected to the remaining terminal portion T. With this configuration, as illustrated in FIG. 11, in the organic EL display device 50a, even when the COF 40 mounting failure occurs, the position of the COF 40 in the direction X does not change before and after the rework. Thus, connection of such COFs 40 to another interface substrate 47 and the like does not require new steps, parts, and the like to be newly provided for the alignment. Note that in FIG. 12, the interface substrate 47 is omitted.

In the organic EL display device 50a, four types of alignment marks 38a, 38b, 42a, and 42b are provided, as illustrated in FIG. 6 to FIG. 12. More specifically, the first terminal alignment marks 38a and the second terminal alignment marks 38b are provided in the frame region F of the organic EL display panel 60. The COFs 40 are provided with the first counter alignment marks 42a and the second counter alignment marks 42b.

As illustrated in FIG. 6 to FIG. 12, for each terminal portion T, two first terminal alignment marks 38a are provided at both ends in the direction Y orthogonal to the direction X, along the direction X in which the first terminal electrodes 36a extend. In other words, the first terminal alignment marks 38a are provided around and along (provided in the vicinity of) the first terminal electrodes 36a, of the plurality of first terminal electrodes 36a, arranged at both ends in the direction Y. The first terminal alignment marks 38a are disposed closer to the display region D than the second terminal alignment marks 38b are. As illustrated in FIG. 7, the first terminal alignment marks 38a are for alignment between the first terminal electrodes 36a and the first counter electrodes 41a, or between the second terminal electrodes 36b and the second counter electrodes 41b, in the terminal portion T (that is, when the COF 40 is first connected (hereinafter, may be referred to as "1st connection")). The first terminal alignment marks 38a are also for alignment between the first terminal electrodes 36a and the first counter electrodes 41a in the other terminal portion t (that is, when the COF 40 is reworked) as illustrated in FIG.

11. Specifically, the first terminal alignment marks 38a and the first counter alignment marks 42a are aligned.

As illustrated in FIG. 6 to FIG. 12, the first counter alignment marks 42a are arranged in the vicinity of and along the first counter electrodes 41a, of the plurality of first counter electrodes 41a, arranged at both ends in the direction Y, to correspond to the two first terminal alignment marks 38a. Further, the first counter alignment marks 42a are disposed closer to the display region D than the second counter alignment marks 42b are.

As illustrated in FIG. 6 to FIG. 12, the second terminal alignment marks 38b are provided at positions separated farther from the display region D than the first terminal alignment marks 38a are, for each terminal portion T. The second terminal alignment marks 38b are arranged in the vicinity of and along the second terminal electrodes 36b, of the plurality of second terminal electrodes 36b, arranged at both ends in the direction Y. As illustrated in FIG. 7, the second terminal alignment marks 38b are for alignment between the second terminal electrodes 36b and the second counter electrodes 41b in the terminal portion T. Specifically, the second terminal alignment marks 38b and the second counter alignment marks 42b are aligned.

As illustrated in FIG. 6 to FIG. 12, the second counter alignment marks 42b are arranged in the vicinity of and along the second counter electrodes 41b, of the plurality of second counter electrodes 41b, arranged at both ends in the direction Y, to correspond to the two second terminal alignment marks 38b. The second counter alignment marks 42b are arranged at positions separated farther from the display region D than the first counter alignment marks 42a are, while being separated from the first counter alignment marks 42a.

These alignment marks 38a, 38b, 42a, and 42b are, for example, marks detectable by a camera or the like for inspection. The alignment marks 38a, 38b, 42a, and 42b are formed of the same material in the same layer as the source electrode 18a and the like, for example. Note that the shapes of the alignment marks 38a, 38b, 42a, and 42b are not particularly limited, and may be the same shape or different shapes.

The alignment between the first terminal alignment marks 38a and the first counter alignment marks 42a, and/or the alignment between the second terminal alignment marks 38b and the second counter alignment marks 42b is generally performed through image recognition. Thus, the positions of the first terminal alignment marks 38a and the first counter alignment marks 42a and the positions of the second terminal alignment marks 38b and the second counter alignment marks 42b may be provided to overlap or to be on the same straight line, and may not be provided to overlap or to be on the same straight line.

In the organic EL display device 50a described above, in each of the subpixels P, a gate signal is input to the first TFT 9a via the gate line 14 to turn on the first TFT 9a, a data signal is written in the gate electrode 14b of the second TFT 9b and the capacitor 9c via the source line 18f, and a current from the power source line 18g corresponding to a gate voltage of the second TFT 9b is supplied to the organic EL layer 23, whereby the light-emitting layer 3 of the organic EL layer 23 emits light to display an image. Note that in the organic EL display device 50a, even when the first TFT 9a is turned off, the gate voltage of the second TFT 9b is held by the capacitor 9c. Thus, the light emission by the light-emitting layer 3 is maintained until the gate signal of the next frame is input.

Next, a method for manufacturing the organic EL display device 50a according to the present embodiment will be described. As illustrated in FIG. 13, the method for manufacturing the organic EL display device 50a according to the present embodiment includes a resin substrate layer forming step (flexible substrate forming step) S1, a thin film transistor layer forming step S2, an organic EL element layer forming step (light-emitting element layer forming step) S3, a sealing layer forming step S4, a terminal portion forming step S5, and a COF mounting step (flexible printed circuit mounting step) S6.

Resin Substrate Layer Forming Step S1

For example, the flexible resin substrate layer 10 is formed by applying a non-photosensitive polyimide resin on a support substrate (not illustrated) such as a glass substrate, and then performing prebaking and postbaking with respect to the applied film.

Thin Film Transistor Layer Forming Step S2

The TFT layer 20 is formed by forming the base coat film 11, the first TFT 9a, the second TFT 9b, the capacitor 9c, and the flattening film 19 on the resin substrate layer 10 formed in the resin substrate layer forming step S1, using a known method, for example. At this time, when the first TFT 9a is formed, the alignment marks 38a, 38b, 42a, and 42b as well as the source electrode 18a and the like are formed together in the frame region F.

Organic EL Element Layer Forming Step S3

The organic EL element layer 30 is formed by forming the plurality of organic EL elements 25 including the first electrode 21, the edge cover 22, the organic EL layer 23 (the hole injection layer 1, the hole transport layer 2, the light-emitting layer 3, the electron transport layer 4, and the electron injection layer 5), and the second electrode 24 on the flattening film 19 of the TFT layer 20 formed in the thin film transistor layer forming step S2, using a known method.

Sealing Layer Forming Step S4

First, for example, an inorganic insulating film such as a silicon nitride film, a silicon oxide film, or a silicon oxynitride film is formed, to cover the organic EL elements 25, using a mask by a plasma CVD method on the organic EL element layer 30 formed in the organic EL element layer forming step S3, whereby the first sealing inorganic insulating film 31 is formed.

Then, the sealing layer 35 is formed by forming the second sealing inorganic insulating film 33, for example, by film-forming, using the plasma CVD method, an inorganic insulating film such as a silicon nitride film, a silicon oxide film, or a silicon oxynitride film to cover the sealing organic film 32, while using a mask.

Terminal Portion Forming Step S5

Each of the plurality of terminal electrodes 36 is formed using a known method in an end portion of the frame region F, to form the plurality of terminal portions T. As illustrated in FIG. 6, the terminal portions T are formed with the first terminal electrodes 36a and the second terminal electrodes 36b electrically connected to the respective first terminal electrodes 36a sequentially arranged as the terminal electrodes 36 from the display region D side. For example, each of the first terminal electrodes 36a and each of the second terminal electrodes 36b is formed by forming an electrode having a predetermined planar shape on the second interlayer insulating film 17 in an end portion of the frame region F by a known method, and film-forming and patterning a flattening film on the electrode thus formed, and then finally forming a predetermined number of openings having a predetermined shape on the flattening film.

COF Mounting Step S6

As illustrated in FIG. 6, for each terminal portion T, the COF 40 including the counter electrodes 41 is mounted.

More specifically, as illustrated in FIG. 7, in the terminal portion T, the first terminal alignment marks 38a and the first counter alignment marks 42a are aligned through image recognition such that the alignment marks 38a and 42a overlap or are aligned on the same straight line in the direction Y. In this process, the alignment between the second terminal alignment marks 38b and the second counter alignment marks 42b may be performed, as necessary.

Then, as illustrated in FIG. 7 and FIG. 8, the anisotropic conductive film 45 is formed to extend on the second terminal electrodes 36b along the direction Y to be in a strip shape, before thermocompression bonding. Then, as indicated by the arrows in FIG. 7 and FIG. 8, the second terminal electrodes 36b and the second counter electrodes 41b are electrically connected to each other, through the anisotropic conductive film 45, by thermocompression bonding. Note that in this COF mounting step S6, no thermocompression bonding between the first terminal electrodes 36a and the first counter electrodes 41a is performed in the terminal portion T (no electrical or physical connection is established therebetween). In other words, the anisotropic conductive film 45 is not interposed between the first terminal electrodes 36a and the first counter electrodes 41a. In this manner, in the COF mounting step S6, in the terminal portion T, only each of the second terminal electrodes 36b is electrically connected to a corresponding one of the second counter electrodes 41b.

Further, as illustrated in FIG. 14, the COF mounting step S6 may further include, in accordance with the need for the rework of the COF 40 (S61), a cutting step S62 and a connection step S63.

Cutting Step S62

When the COF 40 mounting failure occurs in the terminal portion T on the upper side in FIG. 7, of the two terminal portions T illustrated in FIG. 7, the second terminal electrodes 36b in this terminal portion T and the COF 40 mounted on the second terminal electrodes 36b are cut off from the organic EL display panel 60 as illustrated in FIG. 9 and FIG. 10.

More specifically, as illustrated in FIG. 9 and FIG. 10, irradiation with a laser beam is performed along the region surrounding the entirety of the second terminal electrodes 36b, such that the notch portion 37 is formed as a result of notching the region from the terminal portion T in which the COF 40 mounting failure has occurred. As a result, from the first terminal electrodes 36a, the entirety of the second terminal electrodes 36b is separated together with the second counter electrodes 41b, and the entirety of the first counter electrodes 41a is separated. In this manner, the other terminal portion t including only the first terminal electrodes 36a is formed.

Connection Step S63

The first terminal electrodes 36a of the other terminal portion t formed in the cutting step S62 and the first counter electrodes 41a of another COF 40 are electrically connected to each other through the anisotropic conductive film 45.

More specifically, as illustrated in FIG. 11, in the other terminal portion t, the first terminal alignment marks 38a and the first counter alignment marks 42a are aligned through image recognition such that the alignment marks 38a and 42a overlap or are aligned on the same straight line in the direction Y.

Then, as illustrated in FIG. 11 and FIG. 12, the anisotropic conductive film 45 is formed to extend on the first terminal electrodes 36a along the direction Y to be in a strip shape, before thermocompression bonding. Then, as indicated by the arrows in FIG. 11 and FIG. 12, the first terminal electrodes 36a and the first counter electrodes 41a are electrically connected to each other, through the anisotropic conductive film 45, by thermocompression bonding.

In the above-described manner, the organic EL display device 50a of the present embodiment can be manufactured.

As discussed above, according to the organic EL display device 50a of the present embodiment, the following effects can be obtained.

(1) In the organic EL display device 50a, the first terminal electrodes 36a and the second terminal electrodes 36b electrically connected to the respective first terminal electrodes 36a are sequentially arranged from the display region D side as the terminal electrodes 36 in each of the plurality of terminal portions T. Thus, these two terminal electrodes 36a and 36b are formed on the organic EL display panel 60 side. Thus, even when mounting failure occurs in mounting the COF 40 on the terminal portion T, the organic EL display panel 60 with the mounting failure can be reused instead of being discarded.

More specifically, in the organic EL display device 50a, in at least one terminal portion T of the plurality of terminal portions T on which the COF 40 including the counter electrodes 41 (the first counter electrodes 41a and the second counter electrodes 41b) is mounted, the second terminal electrodes 36b and the second counter electrodes 41b are electrically connected to each other through the anisotropic conductive film 45. With this configuration, the second terminal electrodes 36b are cut off from the terminal portion T in which the COF 40 mounting failure has occurred, whereby the other terminal portion t including only the first terminal electrodes 36a is formed. With the COF 40 mounted on this other terminal portion t, the organic EL display device 50a can be obtained that has the first terminal electrodes 36a in the other terminal portion t and the first counter electrodes 41a of the COF 40 for the rework electrically connected to each other through the anisotropic conductive film 45. Thus, the organic EL display device 50a in which the COF 40 mounting failure has occurred does not need to be discarded as a whole and can be reused instead, whereby the manufacturing yield of the organic EL display device 50a in which the COF 40 is mounted can be improved.

(2) In the organic EL display device 50a, two first terminal alignment marks 38a are provided in the frame region F, and two first counter alignment marks 42a corresponding to the first terminal alignment mark 38a are provided in the COF 40. With this configuration, the second terminal electrodes 36b and the second counter electrodes 41b can be easily and precisely aligned in the terminal portion T. Furthermore, in the other terminal portion t, the first terminal electrodes 36a and the first counter electrodes 41a can be easily and precisely aligned.

(3) In the organic EL display device 50a, the frame region F is provided with the second terminal alignment marks 38b, and the COF 40 is provided with the second counter alignment marks 42b corresponding to the second terminal alignment marks 38b. With this configuration, the second terminal electrodes 36b and the second counter electrodes 41b can be more easily and precisely aligned in the terminal portion T.

(4) In the other terminal portion t in the organic EL display device 50a, the notch portion 37 as a result of notching the region surrounding the entirety of the second terminal electrodes 36b is provided, and the notch portion 37 faces the second counter electrodes 41b. With this configuration, the second counter electrodes 41b can be prevented from being electrically connected to the first terminal electrodes 36a on the terminal portion T side unintentionally.

(5) In the organic EL display device 50a, the display region D side end face of the COF 40 connected to the terminal portion T and the display region D side end face of the COF connected to the other terminal portion t are flush. Similarly, an end face of the COF 40 connected to the terminal portion T opposite to the display region D side and an end face of the COF 40 connected to the other terminal portion t opposite to the display region D side are flush. Thus, connection of such COFs 40 to another interface substrate 47 and the like does not require new steps, parts, and the like to be newly provided for the alignment, whereby the manufacturing yield of the organic EL display device 50a can further be improved.

Second Embodiment

Figure 15:
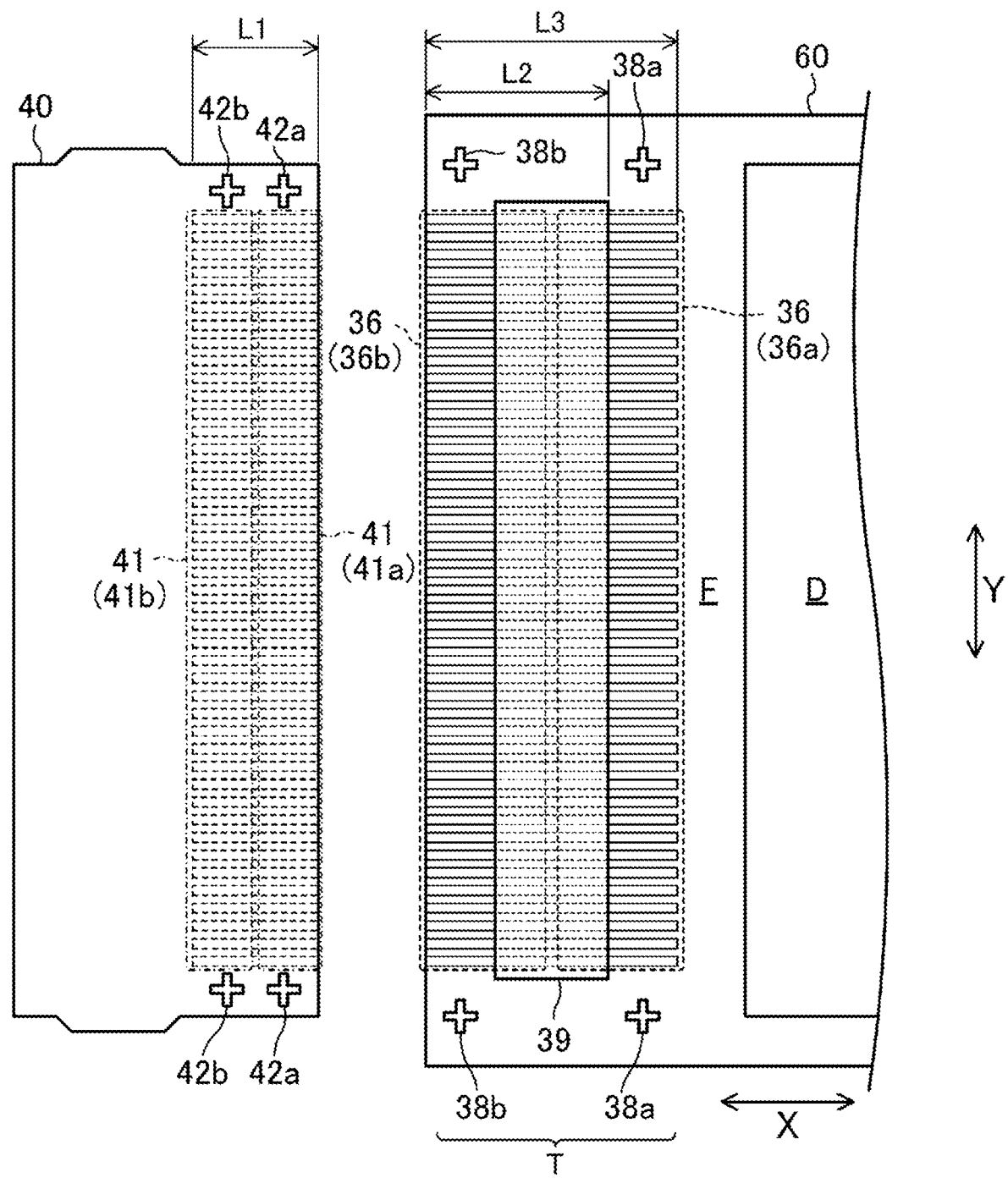
FIG. 15 is a plan view illustrating an organic EL display panel of an organic EL display device according to a second embodiment of the disclosure and a flexible printed circuit board before being connected to the organic EL display panel, and is a diagram corresponding to FIG. 6.
Figure 16:
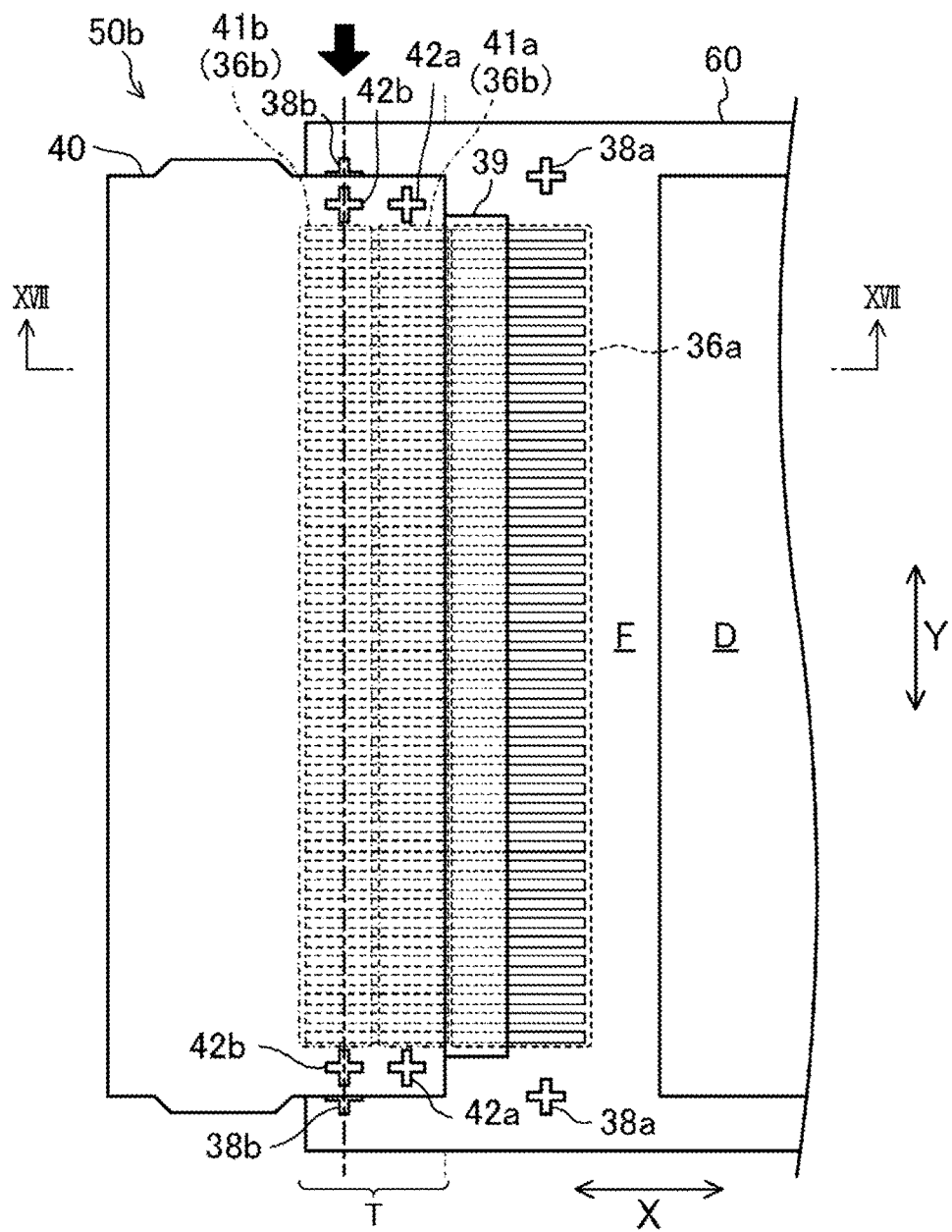
FIG. 16 is a plan view for describing a flexible printed circuit mounting step in a method for manufacturing the organic EL display device according to the second embodiment of the disclosure, and is a diagram corresponding to FIG. 7.
Figure 17:
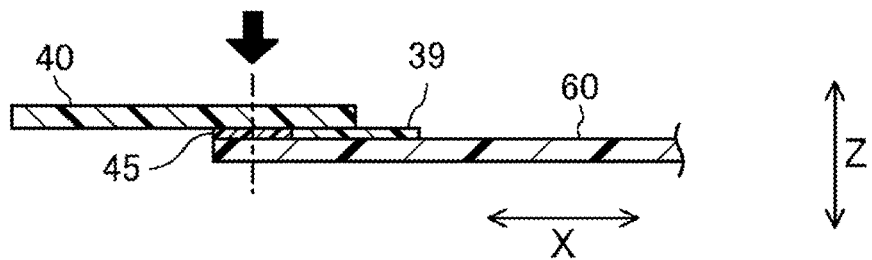
FIG. 17 is a cross-sectional view, taken along line XVII-XVII in FIG. 16, for describing the flexible printed circuit mounting step in the method for manufacturing the organic EL display device according to the second embodiment of the disclosure, and is a diagram corresponding to FIG. 8.
Figure 18:
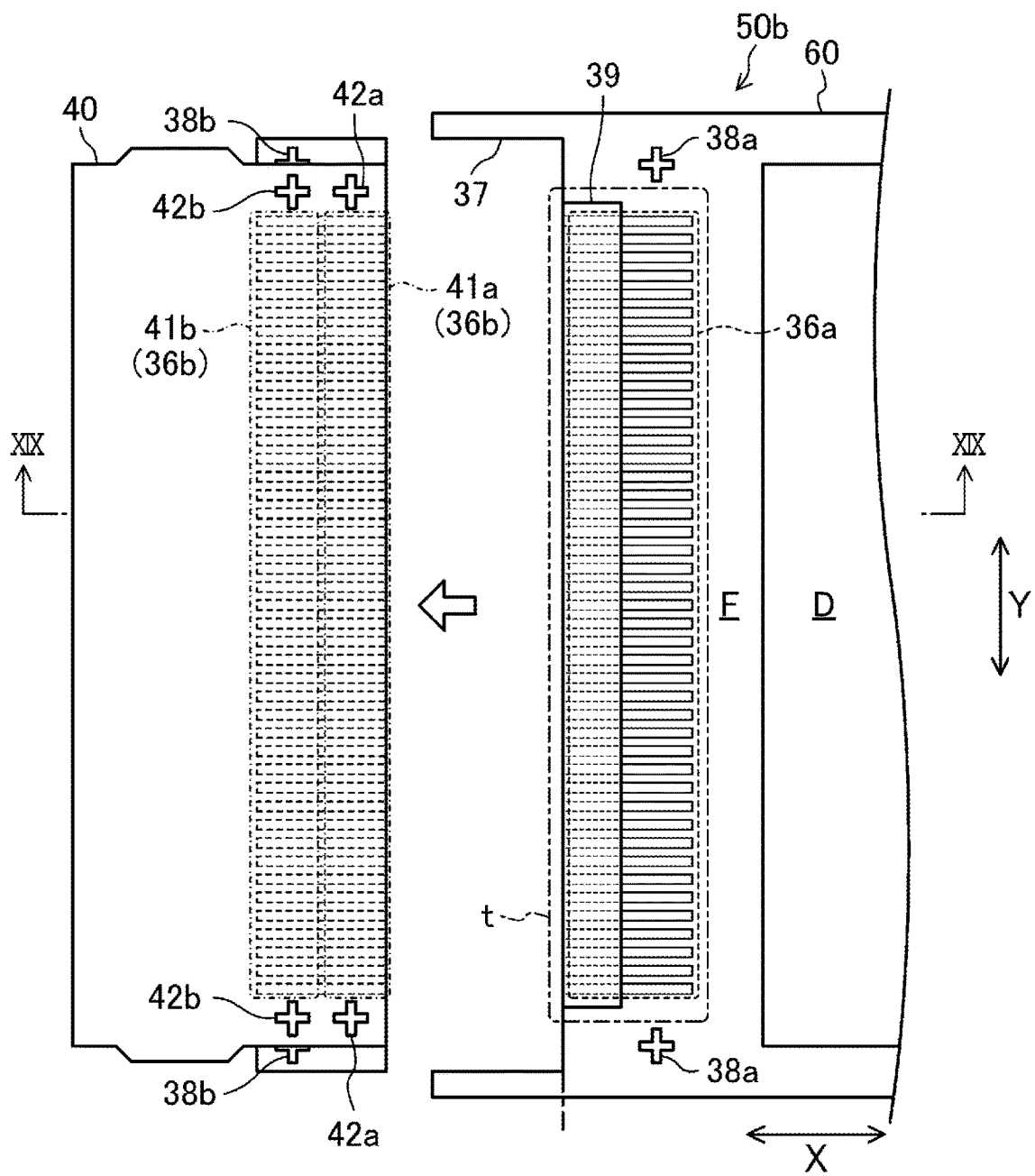
FIG. 18 is a plan view for describing a cutting step in the method for manufacturing the organic EL display device according to the second embodiment of the disclosure, and is a diagram corresponding to FIG. 9.
Figure 19:
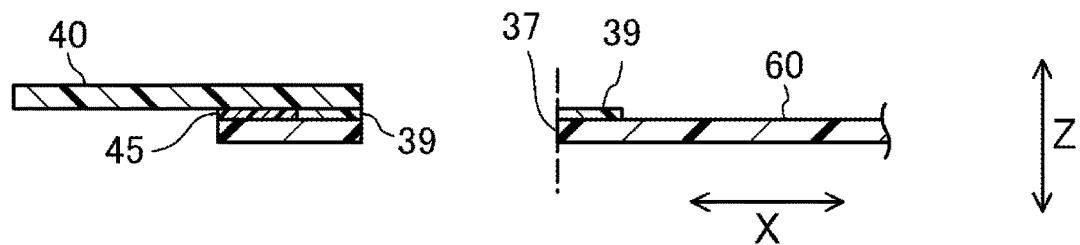
FIG. 19 is a cross-sectional view, taken along line XIX-XIX in FIG. 18, for describing the cutting step in the method for manufacturing the organic EL display device according to the second embodiment of the disclosure, and is a diagram corresponding to FIG. 10.
Figure 20:
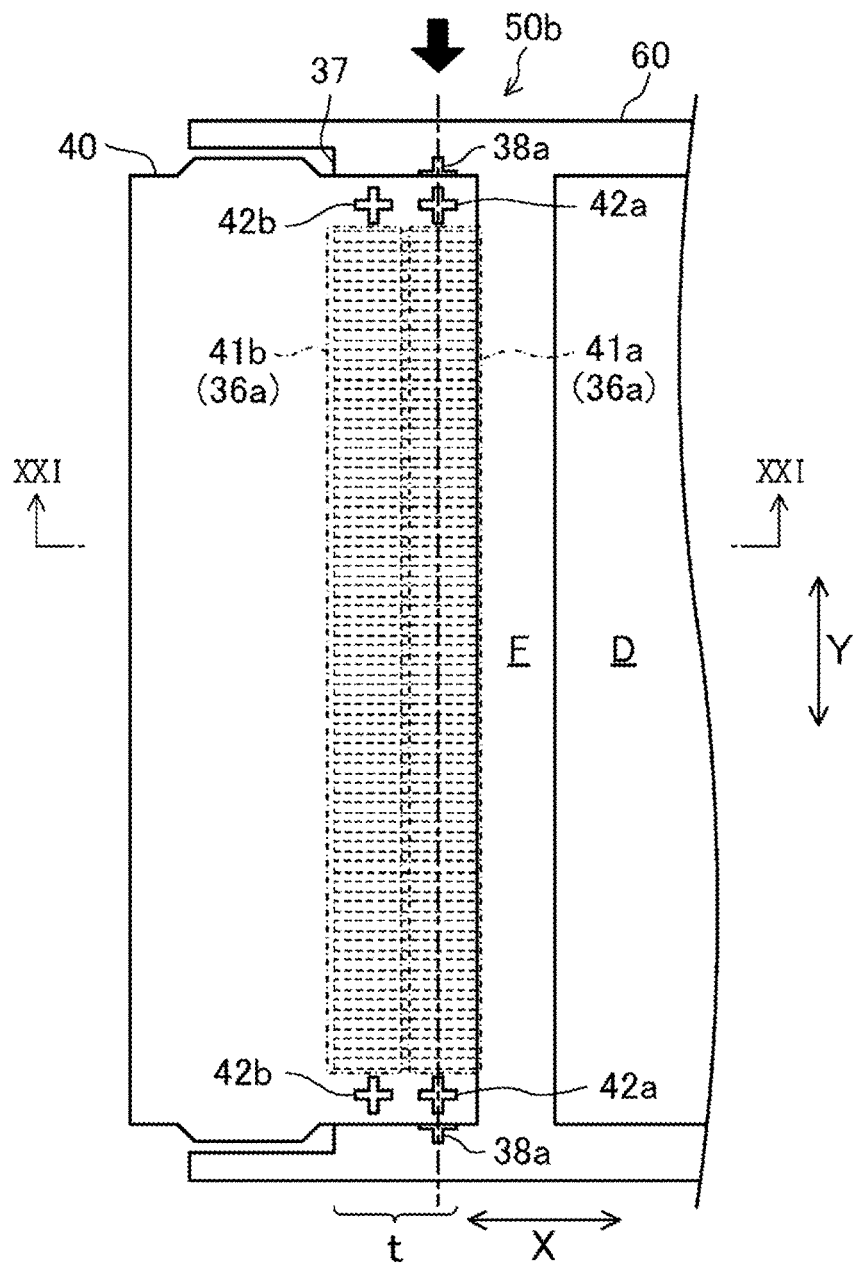
FIG. 20 is a plan view for describing a connection step in the method for manufacturing the organic EL display device according to the second embodiment of the disclosure, and is a diagram corresponding to FIG. 11.
Figure 21:
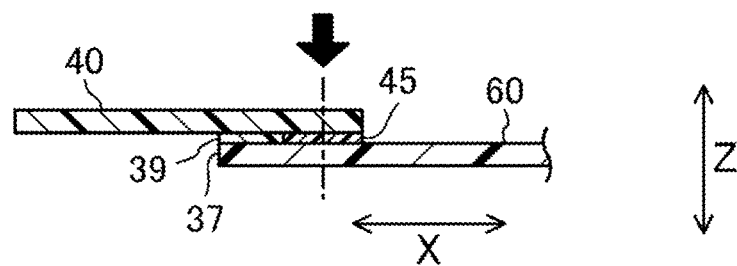
FIG. 21 is a cross-sectional view, taken along line XXI-XXI in FIG. 20, for describing the connection step in the method for manufacturing the organic EL display device according to the second embodiment of the disclosure, and is a diagram corresponding to FIG. 12.
Figure 22:
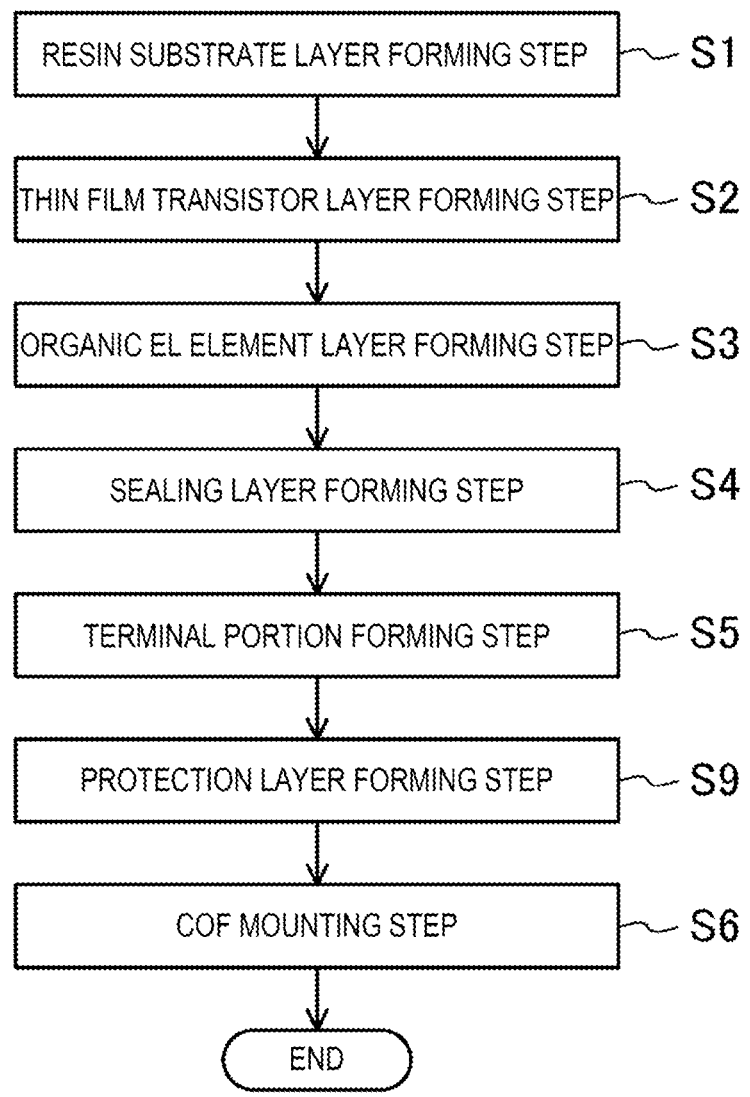
FIG. 22 is a flowchart illustrating the method for manufacturing the organic EL display device according to the second embodiment of the disclosure, and is a diagram corresponding to FIG. 13.
Figure 23:
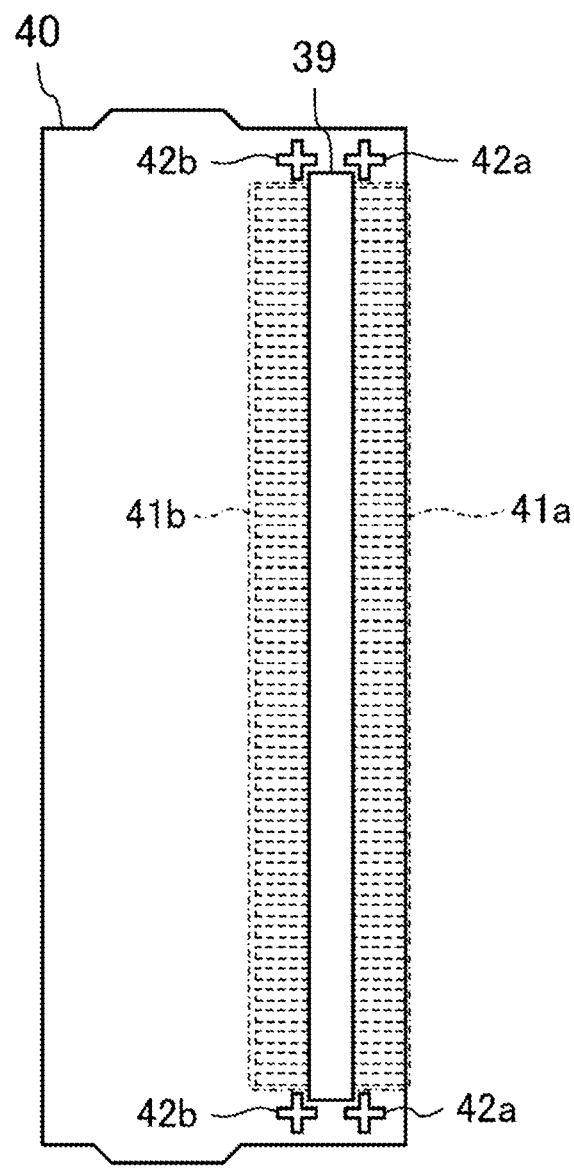
FIG. 23 is a plan view of the flexible printed circuit board illustrating a modification of the organic EL display device according to the second embodiment of the disclosure.

Next, a second embodiment of the disclosure will be described. FIG. 15 is a plan view illustrating an organic EL display panel 60 of an organic EL display device 50b according to the present embodiment and a chip on film (COF) 40 before being connected to the organic EL display panel 60, and is a diagram corresponding to FIG. 6. FIG. 16 is a plan view for describing a COF mounting step S6 in a method for manufacturing the organic EL display device 50b, and is a diagram corresponding to FIG. 7. FIG. 17 is a cross-sectional view, taken along line XVII-XVII in FIG. 16, for describing the COF mounting step S6 in the method for manufacturing the organic EL display device 50b, and is a diagram corresponding to FIG. 8. FIG. 18 is a plan view for describing a cutting step S62 in the method for manufacturing the organic EL display device 50b, and is a diagram corresponding to FIG. 9. FIG. 19 is a cross-sectional view, taken along line XIX-XIX in FIG. 18, for describing the cutting step S62 in the method for manufacturing the organic EL display device 50b, and is a diagram corresponding to FIG. 10. FIG. 20 is a plan view for describing a connection step S63 in the method for manufacturing the organic EL display device 50b, and is a diagram corresponding to FIG. 11. FIG. 21 is a cross-sectional view, taken along line XXI-XXI in FIG. 20, for describing the connection step S63 in the method for manufacturing the organic EL display device 50b, and is a diagram corresponding to FIG. 12. FIG. 22 is a flowchart illustrating the method for manufacturing the organic EL display device 50b, and is a diagram corresponding to FIG. 13. FIG. 23 is a plan view of the COF 40 illustrating a modification of the organic EL display device 50b.

Note that, apart from the terminal portion T and the COF 40, since an overall configuration of the organic EL display device 50b including the display region D, the frame region F, and the like is the same as that of the first embodiment described above, a detailed description thereof will be omitted. Note that constituent portions similar to those in the first embodiment described above are denoted by the identical reference signs, and a description thereof will be omitted.

In the organic EL display device 50b, as illustrated in FIG. 15 to FIG. 23, the frame region F of the organic EL display panel 60 includes one terminal portion T as the terminal portion T and one corresponding COF 40.

In the organic EL display device 50b, as illustrated in FIG. 15, a protection layer 39 is provided between the first terminal electrodes 36a and the second terminal electrodes 36b. More specifically, the protection layer 39 is formed to extend in the direction Y to be in a strip shape connecting the boundaries between the first terminal electrodes 36a and the second terminal electrodes 36b. The width of the protection layer 39 (the length in the direction X), which is not particularly limited, may be about the same as the length of each of the first counter electrodes 41a or each of the second counter electrodes 41b (about half of a length L1 described below) in the direction X, for example. The protection layer 39 serves as a dam for the anisotropic conductive film 45. Specifically, with the protection layer 39 provided, the anisotropic conductive film 45 can be prevented from unintentionally flowing toward the first counter electrode 41a side (the right side, the display region D side in FIG. 15) not electrically or physically connected in the 1st connection, in the terminal portion T. As illustrated in FIG. 3, the protection layer 39 is formed of the same material in the same layer as the edge cover 22 or the flattening film 19 provided above the resin substrate layer 10.

As illustrated in FIG. 15, in the organic EL display device 50b, the total length L1 of each first counter electrode 41a and each second counter electrode 41b in the direction X (the length of the entirety of each counter electrode obtained by linearly integrating each first counter electrode 41a and each second counter electrode 41b) is smaller than a length L2 from an end face of the organic EL display panel 60 opposite to the display region D side to an end edge of the protection layer 39 on the display region D side. The length L1 is smaller than (about half of) the total length L3 of each first terminal electrode 36a and each second terminal electrode 36b (length of the entirety of each terminal electrode obtained by linearly integrating each first terminal electrode 36a and each second terminal electrode 36b). In other words, the length L3 is approximately twice as long as the length L1.

In the terminal portion T after the 1st connection in the organic EL display device 50b with this configuration, as illustrated in FIG. 16 and FIG. 17, the first counter electrodes 41a are opposed to the terminal electrodes 36 (the first terminal electrodes 36a and the second terminal electrodes 36b), respectively, with the protection layer 39 interposed therebetween. Thus, even when misalignment occurs during the 1st connection with the counter electrodes 41 slightly inclined relative to the respective terminal electrodes 36, the first counter electrodes 41a (on the display region D side in particular) are arranged on the protection layer 39. Accordingly, the first counter electrodes 41a are not electrically connected to the terminal electrodes 36.

The organic EL display device 50b can be manufactured, for example, by providing a protection layer forming step S9 described below after the terminal portion forming step S5 and before the COF mounting step S6 as illustrated in FIG. 22 in the method for manufacturing the organic EL display device 50a according to the first embodiment described above.

Terminal Portion Forming Step S5

As illustrated in FIG. 15, the first terminal electrodes 36a and the second terminal electrodes 36b are formed to obtain the length L3 that is approximately twice as long as the length L1.

Protection Layer Forming Step S9

As illustrated in FIG. 15, the protection layer 39 extending in the direction Y to be in a strip shape is formed between the first terminal electrodes 36a and the second terminal electrodes 36b formed in the terminal portion forming step S5. In this process, the protection layer 39 is formed to make the length L2 greater than the length L1, and the width of the protection layer 39 be about half the length L1. The protection layer 39 may be formed together with the flattening film 19 formed in the thin film transistor layer forming step S2, and may be formed together with the edge cover 22 formed in the organic EL element layer forming step S3.

COF Mounting Step S6

As illustrated in FIG. 16 and FIG. 17, in the terminal portion T, alignment between the first terminal alignment marks 38a and the first counter alignment marks 42a is performed through image recognition, to make the first counter electrodes 41a opposed to the terminal electrodes 36 (second terminal electrodes 36b) with the protection layer 39 interposed therebetween. In this process, the alignment between the second terminal alignment marks 38b and the second counter alignment marks 42b may be performed, as necessary.

Then, as illustrated in FIG. 16 and FIG. 17, the anisotropic conductive film 45 is formed to extend, in the region on the second terminal electrodes 36b excluding the protection layer 39 (the region on the left side relative to the protection layer 39 in FIG. 16 and FIG. 17), along the direction Y to be in a strip shape, before thermocompression bonding. Then, as indicated by arrows in FIG. 16 and FIG. 17, the second terminal electrodes 36b and the second counter electrodes 41b are electrically connected to each other, through the anisotropic conductive film 45, by thermocompression bonding.

Further, as illustrated in FIG. 14, the COF mounting step S6 may further include, in accordance with the need for the rework of the COF 40 (S61), the cutting step S62 and the connection step S63.

Cutting Step S62

As illustrated in FIG. 18 and FIG. 19, the notch portion 37 is formed as a result of notching a region surrounding the entirety of the second terminal electrodes 36b including one end portion (the left end portion in FIG. 18 and FIG. 19) of the protection layer 39, from the terminal portion T in which the COF 40 mounting failure has occurred. As a result, the other terminal portion t including only the first terminal electrodes 36a with the other end portion of the protection layer 39 (the right end portion in FIG. 18 and FIG. 19) remaining is formed.

Connection Step S63

As illustrated in FIG. 20 and FIG. 21, in the other terminal portion t, alignment between the first terminal alignment marks 38a and the first counter alignment marks 42a is performed through image recognition.

Then, as illustrated in FIG. 20 and FIG. 21, the anisotropic conductive film 45 is formed in a region on the first terminal electrodes 36a excluding the protection layer 39 (the right region relative to the protection layer 39 in FIG. 20 and FIG. 21) before thermocompression bonding. Then, as indicated by arrows in FIG. 20 and FIG. 21, the first terminal electrodes 36a and the first counter electrodes 41a are electrically connected to each other, through the anisotropic conductive film 45, by thermocompression bonding.

With the organic EL display device 50b described above, the following effects can be obtained in addition to the above-described effects (1) to (3).

(6) The protection layer 39 serving as a dam for the anisotropic conductive film 45 is provided between the first terminal electrodes 36a and the second terminal electrodes 36b. With this configuration, in the terminal portion T, the anisotropic conductive film 45 can be prevented from unintentionally flowing toward the first counter electrodes 41a not electrically connected.

(7) The total length L1 of each first counter electrode 41a and each second counter electrode 41b is smaller than the length L2 from the end face of the resin substrate layer 10 opposite to the display region D side to the end edge of the protection layer 39 on the display region D side. With this configuration, in the terminal portion T, the first counter electrodes 41a are opposed to the terminal electrodes 36 with the protection layer 39 interposed therebetween. Thus, even when crimping of the COF 40 to the terminal portion T involves misalignment, the first counter electrodes 41a are arranged on the protection layer 39 and thus are not electrically connected to the terminal electrodes 36. As a result, the first counter electrodes 41a can be prevented from being electrically connected to the terminal electrodes 36 unintentionally.

(8) In the other terminal portion t, the first end portion of the protection layer 39 is cut together with the second terminal electrodes 36b, and the other end portion of the protection layer 39 remains. Therefore, in the other terminal portion t, the second counter electrodes 41b of the newly mounted COF 40 are opposed to the terminal electrodes 36 with the remaining other end portion of the protection layer 39 interposed therebetween. As a result, unintentional electrical connection of the second counter electrodes 41b with the terminal electrodes 36 can be prevented.

Note that, as illustrated in FIG. 23, in the organic EL display device 50b, the protection layer 39 may be provided between the first counter electrodes 41a and the second counter electrodes 41b of the COF 40, instead of being provided between the first terminal electrodes 36a and the second terminal electrodes 36b. In this case, the protection layer 39 is formed, for example, by a resist or the like.

Other Embodiments

In each of the embodiments described above, the terminal portions are all provided as the terminal portions T including the first terminal electrodes 36a and the second terminal electrodes 36b. However, this should not be construed in a limiting sense, and it suffices if at least one terminal portion T is provided. The numbers of the terminal portions T and the corresponding COFs 40 are not particularly limited, and may be determined as appropriate in accordance with the configuration of the organic EL display device.

In each of the embodiments described above, the COF 40 is connected to each terminal portion T; however, what is connected is not limited to the COF 40 and may be an FPC or the like for example.

In each of the embodiments described above, each first terminal electrode 36a and each second terminal electrode 36b corresponding to each other are continuously provided (as a linearly integrated electrode). However, this should not be construed in a limiting sense, and the electrodes may be separated from each other or may not be linearly provided, as long as the electrodes are electrically connected to each other.

In each of the embodiments described above, each first counter electrode 41a and each second counter electrode 41b corresponding to each other are continuously provided (as a linearly integrated electrode). However, this should not be construed in a limiting sense, and the electrodes may be separated from each other or may not be linearly provided, as long as the electrodes are electrically connected to each other.

In each of the embodiments described above, a dummy terminal that is electrically connected to none of the electrodes may be provided in the plurality of first terminal electrodes 36a to prevent short circuiting between adjacent electrodes. Furthermore, the dummy terminal may be provided in the plurality of second terminal electrodes 36b. Furthermore, the dummy terminal may be provided in the plurality of first counter electrodes 41a. Furthermore, the dummy terminal may be provided in the plurality of second counter electrodes 41b.

In each of the embodiments described above, the four types of alignment marks 38a, 38b, 42a, and 42b are provided. However, this should not be construed in a limiting sense, and only the first terminal alignment marks 38a and the first counter alignment marks 42a may be provided. Still, the four types of alignment marks 38a, 38b, 42a, and 42b are preferably provided, for the sake of easy and precise alignment between electrodes.

In the first embodiment described above, the protection layer 39 may be provided between the first terminal electrodes 36a and the second terminal electrodes 36b or between the first counter electrodes 41a and the second counter electrodes 41b.

In the second embodiment described above, the protection layer 39 is provided between the first terminal electrodes 36a and the second terminal electrodes 36b; however, the protection layer 39 may not be provided.

In the second embodiment described above, the cutting is performed on the protection layer 39 along the direction Y, in which the protection layer 39 extends, so that the protection layer 39 remains. However, this should not be construed in a limiting sense, and the cutting may be performed at a portion closer to the display region D side than the protection layer 39 are, so that the protection layer 39 is entirely removed. Still, the cutting is preferably performed on the protection layer 39, for the sake of prevention of short circuiting between the second counter electrodes 41b and the terminal electrodes 36 in a terminal portion Tb for reconnection.

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

Further, in each of the embodiments described above, the organic EL display device is exemplified and described as the display device, but the disclosure is not limited to the organic EL display device and is also applicable to any flexible display device. For example, the disclosure is applicable to a flexible display device including quantum-dot light emitting diodes (QLEDs), which are light-emitting elements using a quantum dot-containing layer, or the like.

INDUSTRIAL APPLICABILITY

As described above, the disclosure is useful for a flexible display device.

The invention claimed is:
1. A display device comprising:
a flexible substrate;
a thin film transistor layer provided on the flexible substrate;
a light-emitting element layer provided on the thin film transistor layer, the light-emitting element layer including a first electrode, a function layer, and a second electrode, and configuring a display region;
a sealing layer provided to cover the light-emitting element layer;
a frame region provided around the display region;
a plurality of terminal portions provided in the frame region, each of the plurality of terminal portions including a plurality of terminal electrodes that is arranged; and
a plurality of flexible printed circuit boards provided corresponding to the plurality of terminal portions, respectively, each including a plurality of counter electrodes that is arranged opposite the plurality of terminal electrodes, respectively,
wherein each of the plurality of counter electrodes includes a first counter electrode and a second counter electrode electrically connected to the first counter electrode, the first counter electrode and the second counter electrode being sequentially arranged from the display region side,
each of the plurality of terminal portions further includes, among the plurality of terminal electrodes, a first terminal electrode and a second terminal electrode electrically connected to the first terminal electrode, the first terminal electrode and the second terminal electrode being sequentially arranged from the display region side,
in at least one terminal portion of the plurality of terminal portions, the second terminal electrode and the second counter electrode are electrically connected to each other through an anisotropic conductive film, and
in the at least one terminal portion, only the second terminal electrode and the second counter electrode are electrically connected to each other.

2. The display device according to claim 1,
wherein in the at least one terminal portion, the first terminal electrode and the first counter electrode are separated from each other.

3. The display device according to claim 2,
wherein in another terminal portion of the plurality of terminal portions, a length of the plurality of terminal electrodes is configured to be smaller than a length of the plurality of terminal electrodes in the remaining terminal portions of the plurality of terminal portions, and
in the other terminal portion, the first terminal electrode and the first counter electrode are electrically connected to each other through the anisotropic conductive film.

4. The display device according to claim 3,
wherein the other terminal portion is provided with a notch portion as a result of notching a region surrounding an entirety of a plurality of the second terminal electrodes, and
in the other terminal portion, a plurality of the second counter electrodes faces the notch portion.

5. The display device according to claim 3,
wherein a display region side end face of a flexible printed circuit board, among the plurality of flexible printed circuit boards, connected to the at least one terminal portion, and a display region side end face of a flexible printed circuit board, among the plurality of flexible printed circuit boards, connected to the other terminal portion, are flush.

6. The display device according to claim 3,
wherein an end face of the flexible printed circuit board, which is opposite the display region side and connected to the at least one terminal portion, and an end face of the flexible printed circuit board, which is opposite the display region side and connected to the other terminal portion are flush.

7. A display device comprising:
a flexible substrate;
a thin film transistor layer provided on the flexible substrate;
a light-emitting element layer provided on the thin film transistor layer, the light-emitting element layer including a first electrode, a function layer, and a second electrode, and configuring a display region;
a sealing layer provided to cover the light-emitting element layer;
a frame region provided around the display region;
a plurality of terminal portions provided in the frame region, each of the plurality of terminal portions including a plurality of terminal electrodes that is arranged; and
a plurality of flexible printed circuit boards provided corresponding to the plurality of terminal portions, respectively, each of the plurality of flexible printed circuit boards including a plurality of counter electrodes that is arranged opposite the plurality of terminal electrodes, respectively,
wherein each of the plurality of counter electrodes includes a first counter electrode and a second counter electrode electrically connected to the first counter electrode, the first counter electrode and the second counter electrode being sequentially arranged from the display region side,
each of the plurality of terminal portions further includes, among the plurality of terminal electrodes, a first terminal electrode and a second terminal electrode electrically connected to the first terminal electrode, the first terminal electrode and the second terminal electrode being sequentially arranged from the display region side,
in at least one terminal portion of the plurality of terminal portions, the second terminal electrode and the second counter electrode are electrically connected to each other through an anisotropic conductive film,
the flexible substrate is provided with a first terminal alignment mark for alignment between the first terminal electrode and the first counter electrode, and
each of the plurality of flexible printed circuit boards is provided with a first counter alignment mark corresponding to the first terminal alignment mark.

8. The display device according to claim 7,
wherein the flexible substrate is further provided with a second terminal alignment mark for alignment between the second terminal electrode and the second counter electrode at a position separated farther from the display region than the first terminal alignment mark, and
each of the plurality of flexible printed circuit boards is further provided with a second counter alignment mark corresponding to the second terminal alignment mark.

9. A display device comprising:
a flexible substrate;
a thin film transistor layer provided on the flexible substrate;
a light-emitting element layer provided on the thin film transistor layer, the light-emitting element layer including a first electrode, a function layer, and a second electrode, and configuring a display region;
a sealing layer provided to cover the light-emitting element layer;
a frame region provided around the display region;
a plurality of terminal portions provided in the frame region, each of the plurality of terminal portions including a plurality of terminal electrodes that is arranged; and
a plurality of flexible printed circuit boards provided corresponding to the plurality of terminal portions, respectively, each of the plurality of flexible printed circuit boards including a plurality of counter electrodes that is arranged opposite the plurality of terminal electrodes, respectively,
wherein each of the plurality of counter electrodes includes a first counter electrode and a second counter electrode electrically connected to the first counter electrode, the first counter electrode and the second counter electrode being sequentially arranged from the display region side,
each of the plurality of terminal portions further includes, among the plurality of terminal electrodes, a first terminal electrode and a second terminal electrode electrically connected to the first terminal electrode, the first terminal electrode and the second terminal electrode being sequentially arranged from the display region side,
in at least one terminal portion of the plurality of terminal portions, the second terminal electrode and the second counter electrode are electrically connected to each other through an anisotropic conductive film, and
a protection layer is provided between a plurality of first terminal electrodes, including the first terminal electrode, and a plurality of second terminal electrodes, including the second terminal electrode, the protection layer serving as a dam for the anisotropic conductive film.

10. The display device according to claim 9,
wherein the protection layer is formed of a same material and in a same layer as an edge cover or a flattening film provided above the flexible substrate.

11. The display device according to claim 9,
wherein a total length of each counter electrode set, including the first counter electrode and the second counter electrode is smaller than a length from an end face of the flexible substrate opposite a display region side to an end edge of the protection layer on the display region side.

12. The display device according to claim 11,
wherein in the at least one terminal portion, the plurality of first counter electrodes is opposite the plurality of terminal electrodes with the protection layer interposed between the plurality of first counter electrodes and the plurality of terminal electrodes.

13. The display device according to claim 1,
wherein each of the plurality of flexible printed circuit boards includes an IC chip.

14. The display device according to claim 7,
wherein each of the plurality of flexible printed circuit boards includes an IC chip.

15. The display device according to claim 9,
wherein each of the plurality of flexible printed circuit boards includes an IC chip.

* * * * *